United States Patent [19]
Hillis et al.

[11] Patent Number: 6,127,948
[45] Date of Patent: Oct. 3, 2000

[54] BIDIRECTIONAL SYNTHESIS OF PSEUDORANDOM SEQUENCES FOR ARBITRARY ENCODING RESOLUTIONS

[75] Inventors: Alexander E. Hillis, Cambridge; Ronald P. LaBarge, East Greenbush; Robert A. Williams, Troy, all of N.Y.

[73] Assignee: Gurley Precision Instruments, Inc., Troy, N.Y.

[21] Appl. No.: 09/098,805

[22] Filed: Jun. 17, 1998

[51] Int. Cl.[7] .................................................. H03M 1/22
[52] U.S. Cl. ...................................... 341/4; 341/3; 341/67
[58] Field of Search .............................. 341/4, 112, 116, 341/67, 3; 380/49; 340/870.9; 375/130, 150; 250/231.17, 231.18, 231.14

[56] References Cited

U.S. PATENT DOCUMENTS

| | | | |
|---|---|---|---|
| 3,531,798 | 9/1970 | Henri et al. | 341/13 |
| 3,702,471 | 11/1972 | Kennedy et al. | 341/13 |
| 3,982,106 | 9/1976 | Stutz | 341/13 |
| 4,009,377 | 2/1977 | Elms | 235/151.32 |
| 4,628,298 | 12/1986 | Hafle et al. | 340/347 P |
| 4,633,224 | 12/1986 | Gipp et al. | 341/13 |
| 4,914,437 | 4/1990 | Kibrick et al. | 341/3 |
| 4,947,166 | 8/1990 | Wingate et al. | 341/13 |

Primary Examiner—Michael Tokar
Assistant Examiner—Jean B. Jeanglaude
Attorney, Agent, or Firm—Heslin & Rothenberg, P.C.

[57] ABSTRACT

A pseudorandom sequence is bidirectionally synthesized for any arbitrary encoding resolution. The synthesis of such a pseudorandom sequence includes providing within the sequence a conventionally disallowed code (e.g., an all zeroes or an all ones code) and/or pinching out one or more codes of the pseudorandom sequence to provide a sequence that is other than a maximal length sequence. The synthesizing capability can be included in a decoder that accepts, as input, tags of an encoded pseudorandom sequence, and outputs therefrom the absolute positions of those tags.

63 Claims, 16 Drawing Sheets

| POS | CODETAG | PIN | POS | CODETAG | PIN | POS | CODETAG | PIN | POS | CODETAG | PIN |
|---|---|---|---|---|---|---|---|---|---|---|---|
| 000 | 0000000 | 127 | 032 | 0001011 | 65 | 064 | 0001001 | 3 | 096 | 0100101 | 15 |
| 001 | 0000001 | 6 | 033 | 0010110 | 44 | 065 | 0010010 | 30 | 097 | 1001011 | 63 |
| 002 | 0000010 | 12 | 034 | 0101100 | 52 | 066 | 0100100 | 89 | 098 | 0010111 | 19 |
| 003 | 0000100 | 60 | 035 | 1011001 | 74 | 067 | 1001001 | 125 | 099 | 0101110 | 4 |
| 004 | 0001000 | 24 | 036 | 0110011 | 70 | 068 | 0010011 | 105 | 100 | 1011101 | 67 |
| 005 | 0010000 | 49 | 037 | 1100111 | 9 | 069 | 0100110 | 38 | 101 | 0111011 | 111 |
| 006 | 0100000 | 120 | 038 | 1001110 | 20 | 070 | 1001101 | 21 | 102 | 1110111 | 106 |
| 007 | 1000001 | 122 | 039 | 0011101 | 61 | 071 | 0011011 | 8 | 103 | 1101110 | 124 |
| 008 | 0000011 | 48 | 040 | 0111010 | 11 | 072 | 0110110 | 13 | 104 | 1011100 | 83 |
| 009 | 0000110 | 81 | 041 | 1110101 | 34 | 073 | 1101101 | 5 | 105 | 0111001 | 48 |
| 010 | 0001100 | 98 | 042 | 1101010 | 72 | 074 | 1011010 | 18 | 106 | 1110011 | 58 |
| 011 | 0011000 | 76 | 043 | 1010100 | 102 | 075 | 0110101 | 94 | 107 | 1100110 | 90 |
| 012 | 0110000 | 113 | 044 | 0101001 | 50 | 076 | 1101011 | 40 | 108 | 1001100 | 30 |
| 013 | 1100001 | 42 | 045 | 1010011 | 23 | 077 | 1010110 | 84 | 109 | 0011001 | 54 |
| 014 | 1000010 | 116 | 046 | 0100111 | 119 | 078 | 0101101 | 123 | 110 | 0110010 | 44 |
| 015 | 0000101 | 16 | 047 | 1001111 | 103 | 079 | 1011011 | 120 | 111 | 1100101 | 113 |
| 016 | 0001010 | 96 | 048 | 0011111 | 71 | 080 | 0110111 | 22 | 112 | 1001010 | 32 |
| 017 | 0010100 | 26 | 049 | 0111110 | 73 | 081 | 1101111 | 37 | 113 | 0010101 | 2 |
| 018 | 0101000 | 35 | 050 | 1111101 | 33 | 082 | 1011110 | 69 | 114 | 0101010 | 56 |
| 019 | 1010001 | 10 | 051 | 1111010 | 117 | 083 | 0111101 | 95 | 115 | 1010101 | 126 |
| 020 | 0100011 | 69 | 052 | 1110100 | 41 | 084 | 1111011 | 17 | 116 | 0101011 | 88 |
| 021 | 1000111 | 36 | 053 | 1101000 | 93 | 085 | 1110110 | 115 | 117 | 1010111 | 109 |
| 022 | 0001111 | 25 | 054 | 1010000 | 79 | 086 | 1101100 | 76 | 118 | 0101111 | 91 |
| 023 | 0011110 | 59 | 055 | 0100001 | 86 | 087 | 1011000 | 52 | 119 | 1011111 | 57 |
| 024 | 0111100 | 99 | 056 | 1000010 | 80 | 088 | 0110001 | 101 | 120 | 0111111 | 1 |
| 025 | 1111001 | 80 | 057 | 0000111 | 92 | 089 | 1100011 | 59 | 121 | 1111111 | 127 |
| 026 | 1110010 | 84 | 058 | 0001110 | 108 | 090 | 1000110 | 47 | 122 | 1111110 | 55 |
| 027 | 1100100 | 39 | 059 | 0011100 | 45 | 091 | 0001101 | 107 | 123 | 1111100 | 29 |
| 028 | 1001000 | 104 | 060 | 0111000 | 64 | 092 | 0011010 | 110 | 124 | 1111000 | 64 |
| 029 | 0010001 | 118 | 061 | 1110001 | 27 | 093 | 0110100 | 87 | 125 | 1110000 | 15 |
| 030 | 0100010 | 32 | 062 | 1100010 | 96 | 094 | 1101001 | 78 | 126 | 1100000 | 8 |
| 031 | 1000101 | 112 | 063 | 1000100 | 68 | 095 | 1010010 | 98 | 127 | 1000000 | 1 |

FIG. 3

```
--------------------------------------------------------------------------------
-- Chain code decoder for final resolution of 512 measuring steps after quadrature --
--------------------------------------------------------------------------------
-- Modification History
-- 12/22/97
-- Notes: 7 bits index + 2 bits quadrature, no chain codes pinched, buffered output TITLE "Decoder 512";

SUBDESIGN demo512
(
 Clock                : INPUT;
 LoOe_IN              : INPUT;                    -- output enable for low 8 bits of data
 DataHold_IN          : INPUT;               -- lock output to prevent change during read
 INDEX_IN             : INPUT;
 MARK_IN              : INPUT;
 GATE_IN              : INPUT;
 RESET_IN             : INPUT;                     -- when low restart code tag accumulation
 D[9..0]              : OUTPUT;                                           -- output data bus
)

VARIABLE
 LastGate             : DFF;                             -- sine value when last checked
 Buffer[8..0]         : DFF;                                       -- output data buffer
 DataHold             : DFF;            -- register used to sychronize DataHold_IN input
 Gate                 : DFF;                                   -- synchronized sine value
 Mark                 : DFF;                                 -- synchronized cosine value
 LastMark             : DFF;                          -- cosine value when last checked
 SynthData[6..0]      : DFF;                           -- synthesized code tag (CodeTag)
 IndexData[6..0]      : DFF;                              -- code tag as read from disk
 JamSelect[6..0]      : DFF;                              -- where to insert the next bit
 BitPosition[2..0]    : DFF;                              -- where to insert the next bit
 ValidBitCounter[2..0]: DFF;                       -- which bits in the code tag are valid
 ValidBitEqual        : DFF;                             -- helper term for valid bit counter
 Position[8..0]       : DFF;                                -- 9 bit up/down position counter TagUp                : NODE;                                -- increment the tag generator
 TagDown              : NODE;                                -- decrement the tag generator
 CountUp              : NODE;                               -- increment the binary counter
 CountDown            : NODE;                               -- decrement the binary counter
 ShiftRight           : NODE;                         -- shift index accumulator to the right
 ShiftLeft            : NODE;
 LoadRight            : NODE;
 LoadLeft             : NODE;

PreLoadRight         : NODE;                 -- a load right cycle will start on the next clock
 PreLoadLeft          : NODE;                  -- a load left cycle will start on the next clock
 PreShiftRight        : NODE;                -- a shift right cycle will start on the next clock
 PreShiftLeft         : NODE;                 -- a shift left cycle will start on the next clock
 PreRight             : NODE;            -- a shift or load right cycle will start on the next clock
 PreLeft              : NODE;             -- a shift or load left cycle will start on the next clock
 SeekRequest          : NODE;                        -- a seek cycle will start on the next clock
 FullLeft             : DFF;                       -- next insert left will generate a new tag
 FullRight            : DFF;                      -- next insert right will generate a new tag
 CompleteTag          : DFF;                                    -- the index accumulator is full
 InEquality           : DFF;      -- the synthesized code tag and index accumulator are equal
 LastEquality         : DFF;

-- top level timing control state machine output bits
 Delay                : DFF;
 Shift                : DFF;
 Load                 : DFF;
 Cnt                  : DFF;
 Tag                  : DFF;
 Down                 : DFF;
 Restart              : DFF;
 m_idle               : NODE;
```

FIG. 8a

```
BEGIN
-- define some nodes to make the logic easier to follow

TagUp=!Down&Tag;
TagDown=Down&Tag;
CountUp=!Down&Cnt;
CountDown=Down&Cnt;
LoadRight=!Down&Load;
LoadLeft=Down&Load;
ShiftRight=!Down&Shift;
ShiftLeft=Down&Shift;

-------------------------------------------------------------------------------
-- Index Accumulator Logic
-- Note: Movement to right is in the direction of increasing code tag value and corresponds to a
-- rising edge of cosine. Full right is when the counter is at full count.

IndexData[].clk=Clock;

-------------------------------------------------------------------------------
-- 7 Bit Code Tag Accumulator IndexData[0]  =   INDEX_IN& JamSelect[0]                                            -- insert
                 #INDEX_IN&ShiftLeft&!JamSelect[0]                    -- left at null count
                 #IndexData[0]&!Shift&!JamSelect[0]                              -- hold
                 #IndexData[1]&ShiftRight&!JamSelect[0];              -- right at full count IndexData[5..1]=INDEX_IN& JamSelect[5..1]                                           -- insert
                 #IndexData[4..0]&ShiftLeft&!JamSelect[5..1]          -- left at null count
                 #IndexData[5..1]&!Shift&!JamSelect[5..1]                        -- hold
                 #IndexData[6..2]&ShiftRight&!JamSelect[5..1];        -- right at full count IndexData[6]  =   INDEX_IN& JamSelect[6]                                            -- insert
                 #IndexData[5]&ShiftLeft&!JamSelect[6]                -- left at null count
                 #IndexData[6]&!Shift&!JamSelect[6]                              -- hold
                 #INDEX_IN&ShiftRight&!JamSelect[6];                  -- right at full count -------------------------------------------------------------------------------
-- Code Tag Synthesizer
-- Note: forward 1100000, reverse 1000001

SynthData[].clk=Clock;    SynthData[].clrn=!Restart;           -- preset to zero on restart if(TagUp==VCC) then
  SynthData[5..0].d=SynthData[6..1];
  SynthData[6].d=SynthData[0]$SynthData[1]$(SynthData[6..1]==0);
 elsif(TagDown==VCC) then
  SynthData[6..1].d=SynthData[5..0];
  SynthData[0].d=SynthData[0]$SynthData[6]$(SynthData[5..0]==0);
 else
  SynthData[6..0].d=SynthData[6..0];
 end if;

-------------------------------------------------------------------------------
-- 7 Bit Bus Comparator InEquality.clk=Clock;    InEquality.prn=!Restart;      -- preset to not equal on restart
 LastEquality.clk=Clock;  LastEquality.clrn=!Restart;   -- preset to not equal on restart
 InEquality.d=!CompleteTag#(IndexData[]!=SynthData[]);
 LastEquality.d=!InEquality;
```

FIG. 8b

```
-------------------------------------------------------------------------------------------
-- 9 Bit Natural Binary Up/Down Absolute Position Counter, States 0 - 511

Position[].clk=Clock;        Position[].clrn=!Restart;            -- preset to zero on restart if(CountUp) then
   Position[8..2].d=Position[8..2]+1;
 elsif(CountDown) then
   Position[8..2].d=Position[8..2]-1;
 else
   Position[8..2].d=Position[8..2];
 end if;

Position[1].d=!LastMark;          -- derive the two least significant bits from the quadrature
 Position[0].d=LastMark$LastGate;

-------------------------------------------------------------------------------------------
-- Mode Control State Machine -- Subsection 1, define some signals to make the logic easier to follow PreLoadRight=(Mark&Gate&!LastMark&!FullRight&m_idle);               -- next state is load right
PreLoadLeft=(!Mark&Gate&LastMark&!FullLeft&m_idle);                 -- next state is load left
PreShiftRight=(Mark&Gate&!LastMark&FullRight&m_idle);               -- next state is shift right
PreShiftLeft=(!Mark&Gate&LastMark&FullLeft&m_idle);                 -- next state is shift left
PreRight=(Mark&Gate&!LastMark&m_idle);                       -- next state is shift or load right
PreLeft=(!Mark&Gate&LastMark&m_idle);                        -- next state is shift or load left
SeekRequest=(CompleteTag&InEquality&m_idle&(!Gate#(Mark==LastMark)));-- next state is seek cycle -- Subsection 2, quadrature inputs from the incremental timing track Gate.clk=Clock;                                 -- these signals should not be cleared
 Mark.clk=Clock;                                 -- if they are a fault will be detected
 LastMark.clk=Clock;                             -- as soon as RESET_IN is de-asserted
 LastGate.clk=Clock;                                     -- (an invalid quadrature error)

Mark.d=MARK_IN;
 Gate.d=GATE_IN;
 LastMark.d=Mark&!Cnt&!Delay # Mark&!Gate # LastMark&Cnt&Gate # LastMark&Delay&Gate;
 LastGate.d=Gate;

-- Subsection 3, top level of timing control logic

Delay.clk=Clock;        Delay.clrn=RESET_IN;        -- use an external reset to initialize
Cnt.clk=Clock;          Cnt.clrn=RESET_IN;          -- the top level of timing control logic
Tag.clk=Clock;          Tag.clrn=RESET_IN;
Down.clk=Clock;         Down.clrn=RESET_IN;
Load.clk=Clock;         Load.clrn=RESET_IN;
Shift.clk=Clock;        Shift.clrn=RESET_IN;

m_idle=!Delay&!Cnt&!Restart;                    -- sequencer is idle and a new cycle can start
Delay=Cnt;                                      -- delay after increment/decrement cycle
Shift=PreShiftRight#PreShiftLeft;        -- shift new bit into index register from the end
Load=PreLoadRight#PreLoadLeft;                    -- insert new bit without shifting
Cnt=PreRight#PreLeft#SeekRequest;            -- increment or decrement the binary counter
Tag=PreShiftRight#PreShiftLeft#SeekRequest;       -- increment or decrement the code tag
                                -- Down is held at zero unless a load or shift left is pending
Down=PreLeft#(Down&Cnt);     -- it's also blocked from changing while countdown is in progress -- Subsection 4, fault detection logic Restart.clk=Clock;      Restart.prn=RESET_IN;       -- restart code tag accumulation on reset
                                                    -- clear all registers after a fault
Restart.d=((LastMark$Mark)&(LastGate$Gate))#(LastEquality&InEquality);
```

FIG. 8c

```
-- Subsection 5, determine where to insert the next bit in the tag accumulator BitPosition[].clk=Clock;        BitPosition[].clrn=!Restart;
 JamSelect[].clk=Clock;
 FullLeft.clk=Clock;
 FullRight.clk=Clock;

if(LoadRight) then
BitPosition[]=BitPosition[]+1;
elsif(LoadLeft) then
BitPosition[]=BitPosition[]-1;
else
BitPosition[]=BitPosition[];
end if;
FullRight=BitPosition[]==7;
FullLeft=BitPosition[]==0;

FOR i IN 0 TO 6 GENERATE
 JamSelect[i] = BitPosition[]==i &PreLoadRight # BitPosition[]==(i+1) &PreLoadLeft;
END GENERATE;

-- Subsection 6, determine when a complete tag has been acquired in the accumulator ValidBitCounter[].clk=Clock;        ValidBitCounter[].clrn=!Restart;
 ValidBitEqual.clk=Clock;
 CompleteTag.clk=Clock;

CompleteTag.d=ValidBitCounter[]==7;

ValidBitEqual=BitPosition[]==ValidBitCounter[];

if((ShiftLeft&!CompleteTag)#(LoadRight&ValidBitEqual)) then
 ValidBitCounter[]=ValidBitCounter[]+1;
else
 ValidBitCounter[]=ValidBitCounter[];
end if;

-- Subsection 7, data buffer update control

DataHold.clk=Clock;                                  -- flip flop to syncronize Data Hold input
 DataHold.d=DataHold_IN;

------------------------------------------------------------------------------------------------
-- Data Output Electrical Interface With Double Buffered Tri-State Outputs Buffer[].clk=Clock;                                  -- buffer to hold output data
 if(!DataHold) then
  Buffer[].d=Position[];                              -- update the output buffers
 else
  Buffer[].d=Buffer[];                                -- hold previous values
 end if;

-- one ten bit output port with one output enable

FOR i IN 0 TO 8 GENERATE                             -- place the position information on pins D0 to D8
  D[i]=TRI(Buffer[i],!LoOe_IN);
 END GENERATE;
 D[9]=TRI(InEquality,!LoOe_IN);                       -- the most significant bit D9 is the validity flag
END;
```

FIG. 8d

```
--------------------------------------------------------------------------------
-- Chain code decoder for final resolution of 360 measuring steps after quadrature --
--------------------------------------------------------------------------------
-- Modification History
-- 12/22/97
-- Notes: 7 bits index + 2 bits quadrature, 38 chain codes pinched, buffered output TITLE "Decoder 360";

SUBDESIGN demo360
(
 Clock                  : INPUT;
 LoOe_IN                : INPUT;                -- output enable for low 8 bits of data
 DataHold_IN            : INPUT;                -- lock output to prevent change during read
 INDEX_IN               : INPUT;
 MARK_IN                : INPUT;
 GATE_IN                : INPUT;
 RESET_IN               : INPUT;                -- when low restart code tag accumulation
 D[9..0]                : OUTPUT;                              -- output data bus
)

VARIABLE
 LastGate               : DFF;                         -- sine value when last checked
 Buffer[8..0]           : DFF;                                  -- output data buffer
 DataHold               : DFF;         -- register used to sychronize DataHold_IN input
 Gate                   : DFF;                              -- synchronized sine value
 Mark                   : DFF;                            -- synchronized cosine value
 LastMark               : DFF;                       -- cosine value when last checked
 SynthData[6..0]        : DFF;                        -- synthesized code tag (CodeTag)
 IndexData[6..0]        : DFF;                             -- code tag as read from disk
 JamSelect[6..0]        : DFF;                            -- where to insert the next bit
 BitPosition[2..0]      : DFF;                            -- where to insert the next bit
 ValidBitCounter[2..0]  : DFF;                    -- which bits in the code tag are valid
 ValidBitEqual          : DFF;                         -- helper term for valid bit counter
 Position[8..0]         : DFF;                            -- 9 bit up/down position counter TagUp                  : NODE;                            -- increment the tag generator
 TagDown                : NODE;                            -- decrement the tag generator
 CountUp                : NODE;                            -- increment the binary counter
 CountDown              : NODE;                            -- decrement the binary counter
 ShiftRight             : NODE;                      -- shift index accumulator to the right
 ShiftLeft              : NODE;
 LoadRight              : NODE;
 LoadLeft               : NODE;

PreLoadRight           : NODE;            -- a load right cycle will start on the next clock
 PreLoadLeft            : NODE;             -- a load left cycle will start on the next clock
 PreShiftRight          : NODE;           -- a shift right cycle will start on the next clock
 PreShiftLeft           : NODE;            -- a shift left cycle will start on the next clock
 PreRight               : NODE;    -- a shift or load right cycle will start on the next clock
 PreLeft                : NODE;     -- a shift or load left cycle will start on the next clock
 SeekRequest            : NODE;                 -- a seek cycle will start on the next clock
 FullLeft               : DFF;                 -- next insert left will generate a new tag
 FullRight              : DFF;                -- next insert right will generate a new tag
 CompleteTag            : DFF;                           -- the index accumulator is full
 InEquality             : DFF;  -- the synthesized code tag and index accumulator are equal
 LastEquality           : DFF;

-- top level timing control state machine output bits
 Delay                  : DFF;
 Shift                  : DFF;
 Load                   : DFF;
 Cnt                    : DFF;
 Tag                    : DFF;
 Down                   : DFF;
 Restart                : DFF;
 m_idle                 : NODE;
```

FIG. 10a

```
BEGIN
-- define some nodes to make the logic easier to follow

TagUp=!Down&Tag;
TagDown=Down&Tag;
CountUp=!Down&Cnt;
CountDown=Down&Cnt;
LoadRight=!Down&Load;
LoadLeft=Down&Load;
ShiftRight=!Down&Shift;
ShiftLeft=Down&Shift;

------------------------------------------------------------------------------
-- Index Accumulator Logic
-- Note: Movement to right is in the direction of increasing code tag value and corresponds to a
-- rising edge of cosine. Full right is when the counter is at full count.

IndexData[].clk=Clock;

------------------------------------------------------------------------------
-- 7 Bit Code Tag Accumulator IndexData[0] =   INDEX_IN& JamSelect[0]                                             -- insert
                #INDEX_IN&ShiftLeft&!JamSelect[0]                      -- left at null count
                #IndexData[0]&!Shift&!JamSelect[0]                                    -- hold
                #IndexData[1]&ShiftRight&!JamSelect[0];                -- right at full count IndexData[5..1]=INDEX_IN& JamSelect[5..1]                                           -- insert
                #IndexData[4..0]&ShiftLeft&!JamSelect[5..1]            -- left at null count
                #IndexData[5..1]&!Shift&!JamSelect[5..1]                              -- hold
                #IndexData[6..2]&ShiftRight&!JamSelect[5..1];          -- right at full count IndexData[6] =   INDEX_IN& JamSelect[6]                                             -- insert
                #IndexData[5]&ShiftLeft&!JamSelect[6]                  -- left at null count
                #IndexData[6]&!Shift&!JamSelect[6]                                    -- hold
                #INDEX_IN&ShiftRight&!JamSelect[6];                    -- right at full count ------------------------------------------------------------------------------
-- Code Tag Synthesizer
-- Note: 90 states, forward 1100000, reverse 1000001, exception 0100110-1001100

SynthData[].clk=Clock;      SynthData[].clrn=!Restart;          -- preset to zero on restart if(TagUp==VCC) then
  SynthData[5..0].d=SynthData[6..1];
  SynthData[6].d=SynthData[0]$SynthData[1]$(SynthData[6..1]==0)$(SynthData[6..0]==B"0110010");
 elsif(TagDown==VCC) then
  SynthData[6..1].d=SynthData[5..0];
  SynthData[0].d=SynthData[0]$SynthData[6]$(SynthData[5..0]==0)$(SynthData[6..0]==B"0011001");
 else
  SynthData[6..0].d=SynthData[6..0];
 end if;

------------------------------------------------------------------------------
-- 7 Bit Bus Comparator InEquality.clk=Clock;     InEquality.prn=!Restart;         -- preset to not equal on restart
 LastEquality.clk=Clock;   LastEquality.clrn=!Restart;      -- preset to not equal on restart
 InEquality.d=!CompleteTag#(IndexData[]!=SynthData[]);
 LastEquality.d=!InEquality;
```

FIG. 10b

```
-------------------------------------------------------------------------------------------
-- 360 State Truncated Natural Binary Up/Down Absolute Position Counter, States 0 - 359

Position[].clk=Clock;      Position[].clrn=!Restart;              -- preset to zero on restart if(CountUp) then
   if(Position[8..2]!=89) then
    Position[8..2].d=Position[8..2]+1;
   else
    Position[8..2].d=0;
   end if;
 elsif(CountDown) then
   if(Position[8..2]!=0) then
    Position[8..2].d=Position[8..2]-1;
   else
    Position[8..2].d=89;
   end if;
 else
   Position[8..2].d=Position[8..2];
 end if;

Position[1].d=!LastMark;            -- derive the two least significant bits from the quadrature
 Position[0].d=LastMark$LastGate;

-------------------------------------------------------------------------------------------
-- Mode Control State Machine -- Subsection 1, define some signals to make the logic easier to follow PreLoadRight=(Mark&Gate&!LastMark&!FullRight&m_idle);             -- next state is load right
PreLoadLeft=(!Mark&Gate&LastMark&!FullLeft&m_idle);                -- next state is load left
PreShiftRight=(Mark&Gate&!LastMark&FullRight&m_idle);             -- next state is shift right
PreShiftLeft=(!Mark&Gate&LastMark&FullLeft&m_idle);                -- next state is shift left
PreRight=(Mark&Gate&!LastMark&m_idle);                    -- next state is shift or load right
PreLeft=(!Mark&Gate&LastMark&m_idle);                      -- next state is shift or load left
SeekRequest=(CompleteTag&InEquality&m_idle&(!Gate#(Mark==LastMark)));-- next state is seek cycle -- Subsection 2, quadrature inputs from the incremental timing track Gate.clk=Clock;                              -- these signals should not be cleared
 Mark.clk=Clock;                              -- if they are a fault will be detected
 LastMark.clk=Clock;                          -- as soon as RESET_IN is de-asserted
 LastGate.clk=Clock;                                -- (an invalid quadrature error)

Mark.d=MARK_IN;
 Gate.d=GATE_IN;
 LastMark.d=Mark&!Cnt&!Delay # Mark&!Gate # LastMark&Cnt&Gate # LastMark&Delay&Gate;
 LastGate.d=Gate;

-- Subsection 3, top level of timing control logic

Delay.clk=Clock;      Delay.clrn=RESET_IN;          -- use an external reset to initialize
Cnt.clk=Clock;        Cnt.clrn=RESET_IN;            -- the top level of timing control logic
Tag.clk=Clock;        Tag.clrn=RESET_IN;
Down.clk=Clock;       Down.clrn=RESET_IN;
Load.clk=Clock;       Load.clrn=RESET_IN;
Shift.clk=Clock;      Shift.clrn=RESET_IN;

m_idle=!Delay&!Cnt&!Restart;                 -- sequencer is idle and a new cycle can start
Delay=Cnt;                                     -- delay after increment/decrement cycle
Shift=PreShiftRight#PreShiftLeft;         -- shift new bit into index register from the end
Load=PreLoadRight#PreLoadLeft;                       -- insert new bit without shifting
Cnt=PreRight#PreLeft#SeekRequest;         -- increment or decrement the binary counter
Tag=PreShiftRight#PreShiftLeft#SeekRequest;        -- increment or decrement the code tag
                                    -- Down is held at zero unless a load or shift left is pending
Down=PreLeft#(Down&Cnt);     -- it's also blocked from changing while countdown is in progress
```

FIG. 10c

```
-- Subsection 4, fault detection logic

Restart.clk=Clock;        Restart.prn=RESET_IN;              -- restart code tag accumulation on reset
                                                             -- clear all registers after a fault
Restart.d=((LastMark$Mark)&(LastGate$Gate))#(LastEquality&InEquality);

-- Subsection 5, determine where to insert the next bit in the tag accumulator

BitPosition[].clk=Clock;       BitPosition[].clrn=!Restart;
 JamSelect[].clk=Clock;
 FullLeft.clk=Clock;
 FullRight.clk=Clock;

if(LoadRight) then
BitPosition[]=BitPosition[]+1;
elsif(LoadLeft) then
BitPosition[]=BitPosition[]-1;
else
BitPosition[]=BitPosition[];
end if;
FullRight=BitPosition[]==7;
FullLeft=BitPosition[]==0;

FOR i IN 0 TO 6 GENERATE
 JamSelect[i] = BitPosition[]==i &PreLoadRight # BitPosition[]==(i+1) &PreLoadLeft;
END GENERATE;

-- Subsection 6, determine when a complete tag has been acquired in the accumulator ValidBitCounter[].clk=Clock;       ValidBitCounter[].clrn=!Restart;
 ValidBitEqual.clk=Clock;
 CompleteTag.clk=Clock;

CompleteTag.d=ValidBitCounter[]==7;

ValidBitEqual=BitPosition[]==ValidBitCounter[];

if((ShiftLeft&!CompleteTag)#(LoadRight&ValidBitEqual)) then
 ValidBitCounter[]=ValidBitCounter[]+1;
else
 ValidBitCounter[]=ValidBitCounter[];
end if;

-- Subsection 7, data buffer update control

DataHold.clk=Clock;                                         -- flip flop to syncronize Data Hold input
 DataHold.d=DataHold_IN;

-----------------------------------------------------------------------------------------
-- Data Output Electrical Interface With Double Buffered Tri-State Outputs Buffer[].clk=Clock;                                         -- buffer to hold output data
 if(!DataHold) then
  Buffer[].d=Position[];                                     -- update the output buffers
 else
  Buffer[].d=Buffer[];                                       -- hold previous values
 end if;

-- one ten bit output port with one output enable

FOR i IN 0 TO 8 GENERATE                    -- place the position information on pins D0 to D8
  D[i]=TRI(Buffer[i],!LoOe_IN);
 END GENERATE;
 D[9]=TRI(InEquality,!LoOe_IN);              -- the most significant bit D9 is the validity flag
END;
```

FIG. 10d

BIDIRECTIONAL SYNTHESIS OF PSEUDORANDOM SEQUENCES FOR ARBITRARY ENCODING RESOLUTIONS

TECHNICAL FIELD

This invention relates, in general, to the synthesis of pseudorandom bit sequences and, in particular, to N bit wide bidirectional synthesizers of closed loop pseudorandom sequences for arbitrary encoding resolutions up to and including resolutions of $2^N$.

BACKGROUND ART

Pseudorandom bit sequences, also known as chain codes or shift register codes, are employed in various fields, including the synthesis of noise for audio applications, cryptography, and position encoding. In the latter, a pseudorandom sequence is embedded in the scale or disk of a linear or rotary encoding apparatus in the form of a capacitive, magnetic, or optical pattern representing the digital ones and zeroes of the sequence.

The encoder also includes a read station utilizing the appropriate sensing technology to transduce the pattern into digital electrical signals which change as the disk or scale moves in a guided manner relative to it. The total number of discrete positions encoded around the disk, or the number of positions per unit length encoded on a scale, determine the angular or linear resolving power of the encoder. In rotary encoders especially, the number of encoded positions per turn and the fraction of a revolution each position occupies are interchangeably termed the "resolution" of the encoder.

Although the seemingly random electrical output taken directly from such an encoder may be adequate, with the help of a digital correlator, to identify a limited number of special positions (as would a cam, for example), this is not a convenient output format for general use. More commonly, an encoder's output is used to measure angular or linear displacement by subtracting an initial position value from an ending value. By subsequent calculations performed on a series of timed readings, the velocity and acceleration of the motion input being monitored by the encoder may also be computed. Therefore, in order to support typical measurement and control functions, a decoder circuit or program is almost always required to translate the encoder's pseudorandom output into a conventional binary representation.

In accordance with the basic theory of pseudorandom sequences, to perform this translation the decoder determines the monotonic numerical positions of N bit (overlapping, hence "chain" encoded) tags within the sequence embedded in the disk or scale of the encoder, and reports them to a host system. Each N bit tag is unique, thereby indicating the position of the encoder's input mechanism absolutely. This is unlike the method of incremental encoding, which does not encode each position with a unique pattern and therefore reports position information by accumulating counts relative to a starting position or counting register value.

Various types of chain code decoders have previously been used. One example of a decoder is described in U.S. Pat. No. 4,009,377, issued to Elms on Feb. 22, 1977, which is hereby incorporated herein by reference in its entirety. In Elms, the decoder is a circuit which includes a simple bidirectional shift register capable of serially receiving bits of the chain code from two sensors positioned at a linear or angular separation along the code track of the encoder equal to N chain code bits. These two sensors enable bits of the code to be shifted into the register from either direction (depending on the motion of the encoder's disk or scale), such that once the register is loaded in response to an initializing motion of the encoder, changes in the direction of motion resulting in the loss of a data bit at the trailing end of the register are automatically compensated by the shifting in of a new bit at its leading end. Thus a full N bit tag is always maintained in the shifter, available for decoding, despite direction reversals.

However, this method of acquiring the chain code data from the encoder makes the encoder unnecessarily complicated and interferes with retrofitting a chain code track in place of a standard index code track in existing incremental encoder designs. Specifically, the use of two indexing sensors in the encoder inflicts one of two drawbacks. A specially tooled detector pair and/or aperture mask is provided for each and every resolution offered in a given encoder design to accommodate its unique cumulative dimension for N bits. Otherwise, a duplicate parallel or concentric chain code track is provided at a different enough concentric radius or parallel displacement, and perhaps also skewed with respect to the first, so as to permit conventionally dimensioned and mounted sensors to achieve an apparent N bit displacement from one another, as though they were reading from the same track.

In opposition to the inconvenience of its physical implementation within the encoder and the obstacle that presents to retrofitting earlier incremental designs, it is a somewhat counterbalancing advantage of the dual index sensor approach that the bidirectional shift register it accumulates tags with has a simple and elegant construction. Furthermore, if one or more direction reversals occur during the acquisition of the initial code tag from the encoder, a net traverse of only N total bits suffices to fill it, and as described above, subsequent motions may include any number and spacing of direction reversals without producing ambiguity in the code tags acquired en route. Nevertheless, electronic design elegance has little value and digital complexity little cost, when contrasted with the expenses related to extra code tracks, extra sensors, and specially tooled aperture masks and sensor mounting methods. It is therefore desirable to devise a method for serially accumulating the chain code tag within the decoder which, though more electronically complex, obviates the need for a second index sensor in the encoder and still fully minimizes to N bits the initialization angle or distance to be traversed. Elms suffers a further disadvantage that, even though its tag accumulator is suited to minimizing the initialization traverse when the encoder is "wiggled" bidirectionally at the start, the control logic of its decoder initiates the decoding process only when a full N bits have been traversed in one direction or the other. Thus its worst case initialization traverse is 2N bits.

When a full initial code tag is acquired following power up of the encoder/decoder system, the decoder translates the tag into some conventional binary absolute position format. In Elms, the decoding process is accomplished by separately synthesizing within the decoder the same pseudorandom sequence embedded in the encoder's disk or scale. Sequentially synthesized tags are compared to the initial encoder tag maintained in the shift register. When a match is found, a counter indicates the absolute position of the initial tag within the sequence thus discovered. Further motion of the encoder produces changes in the code tag from the encoder which are "tracked" by the decoder's synthesizer, which is capable of both forward and reverse synthesis in order to follow bidirectional encoder motions. This decoding system generally follows the operational principles of other tracking analog to digital converters, which, though they do not employ pseudorandom techniques, are often chosen for their efficiency in applications that do not involve analog inputs having discontinuous behavior.

A further disadvantage of Elms is that the length of the pseudorandom sequence, and therefore the encoding resolution, is limited to schemes having one count short of the full binary complement ($2^N-1$). Elms' sequences are commonly known as "maximal length" sequences, or m-sequences. Thus, the resolutions capable with such an encoder/decoder system have been quite inflexible whenever the encoded scale could not simply be truncated to eliminate undesired working length. Such is always the case with rotary encoders, which require the pseudorandom sequence to form a closed loop where all N bit tags retain their uniqueness to avoid decoding ambiguity, even those spanning the join between a sequence's "end" and "beginning". Furthermore, it is quite common that the resolution of a common incremental rotary encoder, particularly, will be selected based on a requirement that it read out in decimal degrees, or that it perform an English to Metric conversion when used with a pulley or gear of a certain circumference, or that it supply an exact binary number of measuring steps per revolution to simplify subsequent digital calculations, et cetera. If possible, chain code encoders ought to be allowed by the design of their corresponding decoders to offer these same capabilities.

Other decoders have been more flexible in the resolutions that they support, but these decoders do not synthesize pseudorandom sequences. Instead, they use look-up tables, wherein the conventional monotonic binary positions are stored at N bit addresses which are ordered to correspond with the N bit code tags of the pseudorandom sequence. Look-up tables may be contained in the non-volatile storage memory of a microprocessor or computer, or embodied in a dedicated PROM (programmable read only memory). Decoders employing these techniques disadvantageously require memory which may be substantial, depending on the desired resolution. They are also unacceptably slow for supporting contemporary encoding velocities (typically 400,000 quadrature states per second read from the encoder disk or scale, and up to 10 times that many) when depending on a microprocessor for their operation, or too unsophisticated in their operating modes and features when utilizing simpler schemes relying on directly addressed PROMs. Examples of decoders using look-up tables are described in U.S. Pat. No. 4,628,298, issued to Hafle et al. on Dec. 09, 1986, U.S. Pat. No. 4,914,437, issued to Kibrick et al. on Apr. 03, 1990, and U.S. Pat. No. 4,947,166, issued to Wingate et al. on Aug. 07, 1990, each of which is hereby incorporated herein by reference in its entirety.

In every example cited herein, it is a further goal to develop from the encoded path of motion not only a series of digital logic ones and zeroes comprising the featured shift register position code, but also a standard digital quadrature signal pair as might be obtained from any conventional incremental encoder. The quadrature signal pair provides direction sensing of the motion of the reading station relative to the encoded path through standard quadrature decoding techniques employed in the decoder. Also, very importantly, it controls the spatial timing of the samples taken of the shift register code path. This ensures the strongest possible contrast between the detector signals of opposite (binary) polarities, thereby enhancing immunity to original imperfections in, contamination of, or damage to the disk or scale, to sensor/mask misalignment, and to electrical noise in the sensing circuitry.

The most commonly cited method of ensuring that the desired spatial timing is achieved by the quadrature signals is to embed a so-called timing track adjacent to the chain code track in the same substrate, either concentrically, if the encoded path of motion is arranged on a wheel, or in parallel, if the encoded path is linear or cylindrical. In every case, the timing track takes the form of a simple incremental encoder track, having nominally equal on/off duty cycle, and read by sensors positioned, or masked by displaced gratings, such that the resulting signals are offset spatially by one quarter of the incremental cycle. The period of the incremental timing track is usually selected such that a complete quadrature cycle occludes the same angle in a rotary configuration, or spans the same displacement in a linear one, as a single code bit of the chain code track. Wingate provides a very clear representation of this method in the form of an example code wheel and a description of operation which presumes the reader has a good general knowledge of conventional incremental encoding techniques.

Other alternatives have been offered in regard to the selection of the period of the incremental timing track. For example, Elms teaches a spatial timing method in which every successive quadrature transition aligns with the center of each consecutive bit position of the chain code in the adjacent track. Kibrick summarizes these arrangements, where the ratio of quadrature transitions to chain code bits is 4:1 and 1:1 respectively, and also demonstrates the theoretical validity of a 2:1 ratio as well. The logic of extrapolation suggests that whereas a practical minimum of one timing transition per chain code bit suffices to guarantee a good quality sample of each, perhaps a ratio even greater than 4:1 may be possible. In a manner of speaking, this is the case in circumstances involving absolute electronic subdivision of the quadrature cycle to augment resolution.

However, for the purpose of describing the background of the present invention, it is useful to point out that only a timing track having a period selected to provide four quadrature transitions per chain code bit has general commercial value at this time. This owes to practical considerations arising from the state of the art. For example, if the chain encoding system depends on optical principles for its embodiment, the chain code track itself is sensed by a single detector, or through a single masking aperture, whose areal dimensions are restricted to roughly those of a single code bit embedded in the track. This is not so for the incremental timing track. Since the timing track is a simple series of alternating transparent and opaque (or reflective and absorptive) markings, large area sensors can be used to view the track through a grating mask, thus generating quadrature timing signals tens or hundreds of times stronger when provided with illumination of equal intensity. This arrangement provides a fourfold increase in encoding resolution at no penalty to cost or reliability, just as it has always done with conventional incremental encoders. To coarsen the incremental timing track with respect to the indexing track serves no useful purpose. In so far as other encoding technologies relying on capacitive or inductive sensing ought to be limited by the same or similar geometric constraints as the optical ones, and may not be as amenable to analogous means of driving resolution higher by purely electronic means, this point is reinforced. It is an object of the present invention to work properly with any of the three standard ratios mentioned as well as in cooperation with known electronic resolution enhancement circuits such as are already used in conventional absolute encoders.

Based on the foregoing, a need still exists for an N bit synthesizer that can bidirectionally synthesize a pseudorandom sequence for any arbitrary encoding resolution up to and including a resolution of $2^N$. A further need exists for a decoder that does not use look-up tables, but instead uses the bidirectional synthesizer of the present invention. A yet further need exists for a decoder that can bidirectionally fill an accumulator with code tags using input from only one index sensor so as to easily retrofit to existing designs and still fully minimize to N bits the initialization angle or distance to be traversed when first filling the accumulator immediately after power up. Another need exists for a decoder that can keep up with contemporary encoding velocities. A yet further need exists for a decoder that works with 1:1, 2:1, or 4:1 spatial timing ratios, and also in conjunction with standard absolute resolution enhancement circuits.

SUMMARY OF THE INVENTION

The shortcomings of the prior art are overcome and additional advantages obtained through the provision of a method of synthesizing pseudorandom sequences. The method includes, for instance, bidirectionally synthesizing a pseudorandom sequence of a plurality of code tags, which includes at least one of: including in the pseudorandom sequence a code tag that has conventionally been considered disallowed (according to, for example, the theory of m-sequences); and pinching out one or more code tags of the pseudorandom sequence.

In one example, the inclusion of the conventionally disallowed code tag in the pseudorandom sequence includes detecting, during forward synthesis of the pseudorandom sequence, a predetermined code tag of the pseudorandom sequence; shifting bits of the predetermined code tag to the left, when the predetermined code tag is detected; and entering a binary digit at the right of the shifted predetermined code tag, such that the conventionally disallowed code tag is entered.

In another example, the method includes exiting the disallowed code tag. In one example, exiting includes detecting, during forward synthesis of the pseudorandom sequence, the disallowed code tag; shifting bits of the disallowed code tag to the left, when the code tag is detected; and entering a binary digit at the right of the shifted disallowed code tag, such that the conventionally disallowed code tag is exited.

In another example, the inclusion of the conventionally disallowed code tag in the pseudorandom sequence includes detecting, during reverse synthesis of the pseudorandom sequence, a predetermined code tag of the pseudorandom sequence; shifting bits of the predetermined code tag to the right, when the predetermined code tag is detected; and entering a binary digit at the left of the shifted predetermined code tag, such that the conventionally disallowed code tag is entered.

In another example, the method includes exiting the disallowed code tag. The method includes, for instance, detecting, during reverse synthesis of the pseudorandom sequence, the disallowed code tag; shifting bits of the disallowed code tag to the right, when the disallowed code tag is detected; and entering a binary digit at the left of the shifted disallowed code tag, such that the conventionally disallowed code tag is exited. This permits, for instance, the synthesizer to freely enter and exit the disallowed code tag for both forward and reverse synthesis so as to effect its uniform bidirectional inclusion.

In yet another example, the pinching out includes shifting bits of a selected code tag of the pseudorandom sequence to the left during forward synthesis, and entering, at the right of the shifted selected code tag, a value for a next bit of the pseudorandom sequence that is inverted from the value that would naturally occur at that position of the pseudorandom sequence, such that all the code tags naturally occurring between the selected tag and the new one so enforced are skipped.

In a further example, the pinching out includes shifting bits of a selected code tag of the pseudorandom sequence to the right, during reverse synthesis, and entering, at the left of the shifted selected code tag, a value for a next bit of the sequence that is inverted from the value that would naturally occur at that position of the sequence. Thus, in one example, all of the code tags naturally occurring between the selected tag and the new one so enforced are skipped, with the additional restriction that the selected code tag is chosen such that the same group of tags is pinched out from the sequence for both forward and reverse synthesis so as to effect its uniform bidirectional exclusion.

In one embodiment of the present invention, the pseudorandom sequence is used in a decoder. The decoder is usable in providing the absolute position of one or more code tags of the pseudorandom sequence.

In another embodiment of the invention, a method of bidirectionally synthesizing pseudorandom sequences is provided. The method includes, for instance, selecting a resolution for which a pseudorandom sequence is to be bidirectionally synthesized, and bidirectionally synthesizing the pseudorandom sequence for the selected resolution. The bidirectionally synthesizing includes using other than a maximal length sequence.

In one example, the bidirectional synthesizing includes pinching out one or more code tags of the pseudorandom sequence.

In another example, the selected resolution is a resolution of $2^N$, and the conventionally disallowed code tag is included in the pseudorandom sequence.

In another aspect of the present invention, a bidirectional synthesizer is provided. The bidirectional synthesizer includes, for instance, a bidirectional shifter adapted to provide, at its outputs, bits of a pseudorandom sequence; a feed forward network coupled to the bidirectional shifter adapted to provide a next bit of the pseudorandom sequence, when the bidirectional shifter is proceeding in a forward direction; a feed reverse network coupled to the bidirectional shifter adapted to provide a next bit of the pseudorandom sequence, when the bidirectional shifter is proceeding in a reverse direction; and one or more logic circuits coupled to the feed forward network and the feed reverse network adapted to provide a code tag in the pseudorandom sequence which has conventionally been considered a disallowed code tag, and/or a pinching out of one or more code tags of the pseudorandom sequence.

In another embodiment, a bidirectional synthesizer is provided that includes means for bidirectionally synthesizing a pseudorandom sequence, and means for including in the pseudorandom sequence a code tag that has conventionally been considered a disallowed tag.

In one example, the means for bidirectionally synthesizing includes a bidirectional shifter adapted to provide, at its output, bits of the pseudorandom sequence; a feed forward network coupled to the bidirectional shifter adapted to provide a next bit of the pseudorandom sequence, when the bidirectional shifter is proceeding in a forward direction; and a feed reverse network coupled to the bidirectional shifter adapted to provide a next bit of the pseudorandom sequence, when the bidirectional shifter is proceeding in a reverse direction.

In yet another aspect of the present invention, a synthesizing apparatus is provided. The apparatus includes, for instance, a bidirectional synthesizer adapted to bidirectionally synthesize a pseudorandom sequence of a plurality of code tags. The bidirectional synthesizer includes one or more logic circuits adapted to pinch out one or more tags of the pseudorandom sequence.

In a further aspect of the present invention, at least one program storage device readable by a machine, tangibly embodying at least one program of instructions executable by the machine to perform a method of synthesizing pseudorandom sequences is provided. The method includes, for example, bidirectionally synthesizing a pseudorandom sequence of a plurality of code tags, in which the bidirectionally synthesizing includes at least one of the following: including in the pseudorandom sequence a code tag that has conventionally been considered a disallowed code tag; and pinching out of one or more code tags of the pseudorandom sequence.

In another embodiment of the present invention, an article of manufacture is provided. The article of manufacture includes at least one computer usable medium having computer readable program code means embodied therein for causing the bidirectional synthesis of pseudorandom sequences. The computer readable program code means in the article of manufacture includes, for instance, computer readable program code means for causing a computer to select a resolution for which a pseudorandom sequence is to be bidirectionally synthesized; and computer readable program code means for causing a computer to bidirectionally synthesize the pseudorandom sequence for the selected resolution using other than a maximal length sequence.

In yet a further aspect of the present invention, a decoder is provided. The decoder includes, for example, an accumulator adapted to receive tags of a pseudorandom sequence provided by an encoder; and a bidirectional synthesizer adapted to synthesize tags of the pseudorandom sequence. The bidirectional synthesizer is adapted to include in the pseudorandom sequence a code tag that has conventionally been considered disallowed, and/or to pinch out one or more code tags of the pseudorandom sequence. The decoder further includes a comparator coupled to the accumulator and the bidirectional synthesizer, which is adapted to compare accumulated tags and synthesized code tags; and a counter which is adapted to indicate absolute position of one or more accumulated tags, when the comparator indicates equality.

In one example, the accumulator is adapted to receive bits of the tags via only one index channel input to the accumulator. In a further example, a distance traversed on the encoder to provide a complete initial tag within the accumulator is minimized to a net traverse of N bits for a decoder utilizing N bit tags, whether or not direction reversals occur during the traverse.

In one embodiment, the decoder is implementable on a PLD (programmable logic device).

In another aspect of the present invention, a method of decoding is provided. The method includes, for instance, accumulating a tag of a pseudorandom sequence provided by an encoder; synthesizing a code tag of the pseudorandom sequence, wherein the pseudorandom sequence includes a conventionally disallowed code tag, and/or one or more tags having been pinched out; comparing the accumulated tag and the synthesized tag; repeating the synthesizing and the comparing until the comparing indicates equality; and determining the absolute position of the accumulated tag, when equality is indicated. In one example, the absolute position is determined by counting the iterations of the synthesizing and comparing leading up to the indicating of equality between the accumulated tag and the final synthesized tag.

In one example, the decoding method further includes tracking movement of the encoder. The method includes, for instance, accumulating tags of the pseudorandom sequence provided by the encoder; bidirectionally synthesizing code tags of the pseudorandom sequence; and comparing the accumulated tags and the synthesized code tags until the comparing indicates inequality, an error is encountered or power is turned off; and updating the absolute position, when comparing indicates equality.

In yet a further aspect of the present invention, a decoder is provided. The decoder comprises, for instance, means for accumulating a tag of a pseudorandom sequence provided by an encoder; means for synthesizing a code tag of the pseudorandom sequence, wherein the pseudorandom sequence includes a conventionally disallowed tag, and/or one or more tags having been pinched out; means for comparing the accumulated tag and the synthesized code tag; means for repeating the synthesizing and the comparing until the comparing indicates equality; and means for determining the absolute position of the accumulated tag, when equality is indicated.

In one instance, the decoder further comprises means for tracking movement of the encoder.

In another aspect of the present invention, at least one program storage device readable by a machine, tangibly embodying at least one program of instructions executable by the machine to perform a method of decoding is provided. The method includes, for example, accumulating a tag of a pseudorandom sequence provided by an encoder; synthesizing a code tag of the pseudorandom sequence, wherein the pseudorandom sequence includes one disallowed tag, and/or one or more tags have been pinched out of the pseudorandom sequence; comparing the accumulated tag and the synthesized tag; repeating the synthesizing and the comparing until the comparing indicates equality; and determining an absolute position of the accumulated tag, when equality is indicated.

Further, in another embodiment, an article of manufacture is provided. The article of manufacture includes, at least one computer usable medium having computer readable program code means embodied therein for causing decoding. The computer readable program code means in the article of manufacture includes, for instance, computer readable program code means for causing a computer to accumulate a tag of a pseudorandom sequence provided by an encoder; computer readable program code means for causing a computer to synthesize a code tag of the pseudorandom sequence, wherein the pseudorandom sequence includes a conventionally disallowed tag, and/or one or more tags having been pinched out; computer readable program code means for causing a computer to compare the accumulated tag and the synthesized code tag; computer readable program code means for causing a computer to repeat the synthesizing and the comparing until the comparing indicates equality; and computer readable program code means for causing a computer to determine an absolute position of the accumulated tag, when equality is indicated.

The synthesizer of the present invention can advantageously bidirectionally synthesize a pseudorandom sequence of any arbitrary resolution, including a resolution of $2^N$ or any other resolution. Further, the synthesizer of the present invention can advantageously be implemented within a decoder used to provide absolute position information. Such a decoder would not use a look-up table, but instead, would use the synthesizer of the present invention to synthesize a pseudorandom sequence. The decoder of the present invention can bidirectionally fill an accumulator with code tags, using input from only one index sensor and still fully minimize to N bits the initialization angle or distance to be traversed when filling the accumulator.

Additionally, the decoder of the present invention can advantageously reset itself to await a fresh code tag when a failure is detected, it can report data invalid while waiting for a complete initial code tag, it can report data invalid while in the process of decoding the initial code tag and report data valid when the tag search is complete and synchronization between the sequence of tags issued by the encoder and the sequence of tags synthesized by the decoder is established. The present invention advantageously immediately reports any failure to maintain ongoing synchronization of the physical chain code with the electronically synthesized one as a data invalid condition.

Further, the decoder can work with various spatial timing ratios, including 1:1, 2:1 or 4:1 ratios. Additionally, the decoder of the present invention can keep up with contemporary encoding velocities. The decoder of the present invention can find absolute position quickly, operate effectively in conjunction with a host apparatus depending on its veracity to preserve convenience, efficiency, and/or safety, and be compact and economical in commercial applications.

In accordance with the principles of the present invention, the decoder can be implemented almost completely on a single commercially available PLD of modest size and cost, and can therefore play a significant role in the commercialization of chain encoding generally.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention will be apparent from the following detailed description taken in conjunction with the accompanying drawings in which:

FIG. 3 is a table depicting one embodiment of a 7 bit natural pseudorandom sequence, in accordance with the principles of the present invention;

FIGS. 8a–8d depict an example of a Hardware Description Language listing implementing a 7 bit decoder, in accordance with the principles of the present invention;

FIGS. 10a–10d depict an example of a Hardware Description Language listing implementing a 7 bit decoder having 38 tags pinched, in accordance with the principles of the present invention.

BEST MODE FOR CARRYING OUT THE INVENTION

In accordance with the principles of the present invention, a capability is provided that enables pseudorandom bit sequences to be bidirectionally synthesized for arbitrary resolutions. This capability is applicable to various fields of endeavor, including, but not limited to, the synthesis of noise for audio applications, cryptography, and position encoding. In the examples described in detail herein, the bidirectional synthesizing capability of the present invention is included within a decoder used to determine the absolute positions of chain code tags within a pseudorandom sequence.

It is assumed that the decoder is used in conjunction with a pseudorandom position encoder of predominantly conventional construction. By prior arrangement, the encoder issues the same sequential pattern as that which is synthesized on the fly by the decoder. As also described in the background art, incremental timing track signals which have nominally equal on/off duty cycles, and which are offset spatially by one quarter of the incremental cycle, accompany the pseudorandomly encoded "index" signal to support direction sensing and control code bit sample timing. Timing variations based on 1:1, 2:1, and 4:1 ratios of timing track transitions per chain code bit are acceptable for achieving the aims of the present invention. Additional absolutely coded resolution derived from the timing track of an encoder employing a 2:1 or 4:1 timing ratio, or obtained from the electronic resolution enhancement technique commonly known as "interpolation", may be concatenated with, or included in, the final decoder position output, without departing from the spirit of the present invention.

In the interest of simplification, and because of the scheme's preeminence in industrial practice, it will be implicit that the digital signals named as inputs in the following tutorial examples provide quadrature timing track transitions in a ratio of 4:1 with the bits of the chain code track. Also in accordance with the principles of the present invention, the pseudorandom index track of the encoder is assumed to be read by a single sensor, unlike more primitive pseudorandom encoding schemes which rely on redundant sensing channels to accommodate bidirectional motion. Where an encoder with dual sensing channel outputs spatially displaced by N cycles is available, the decoder of the present invention may be coupled to it such that one or the other redundant index channel is simply left unconnected and the decoder will still function perfectly.

Figure 1:
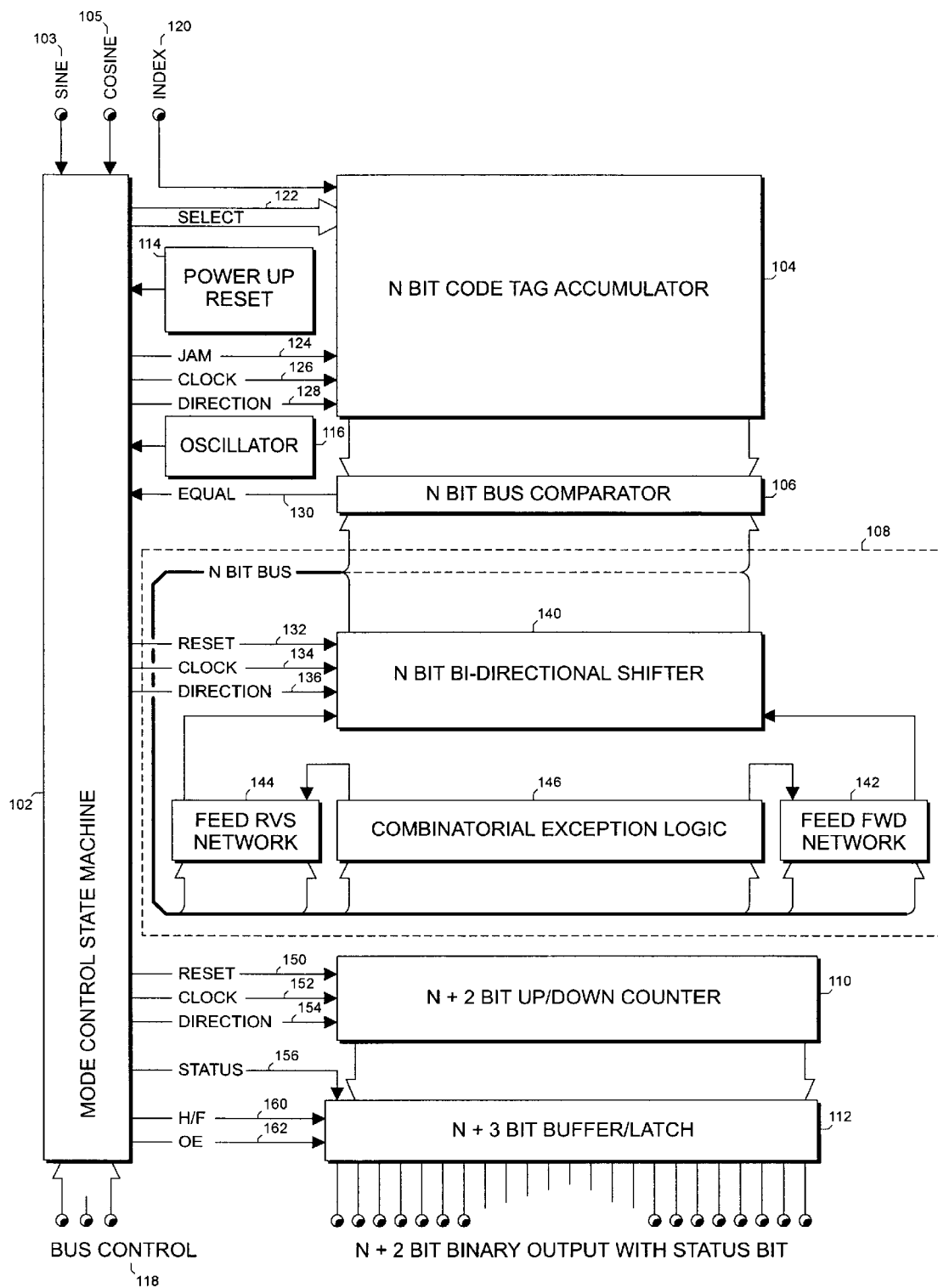
FIG. 1 is a block diagram depicting one example of a decoder incorporating and using the principles of the present invention.

One example of a decoder incorporating and using the principles of the present invention is depicted in FIG. 1. In the figures and throughout the text, reference is made to N. As used herein, N represents the length of the chain code tag required to unambiguously encode a maximum of $2^N$ positions. Referring to FIG. 1, a decoder includes, for instance, a mode control state machine 102, an N bit tag accumulator 104, an N bit bus comparator 106, a bidirectional chain code synthesizer 108, an up/down counter 110, and a buffer/latch 112, each of which is described in detail below.

Mode control state machine 102 has various inputs and outputs. It includes the logic which controls the other components of the decoder, and it dictates the operational modes of the decoder as a whole. It may be implemented as one large state machine or as a collection of simpler state machines. Wide latitude exists for partitioning the mode control state machine in a number of different ways without changing its overall functionality. The choices depend upon the preferences of the designer and the constraints placed on the system by the technologies selected to implement it.

Inputs to mode control state machine 102 include sine spatial timing signal 103 and cosine spatial timing signal 105, which are in quadrature. These signals are read from the incremental timing track of an encoder coupled to the decoder. The quadrature signal pair provides direction sensing of the motion of the encoder's reading station relative to the encoded path through standard quadrature evaluation techniques.

The mode control state machine 102 includes a quadrature evaluation function that is used to decode the timing track data to determine the direction in which the encoder is moving. The quadrature decode function may also optionally detect disallowed quadrature state transitions. Disallowed state transitions, consisting essentially of simultaneous changes from one logic level to another in both the sine and cosine signals, indicate a failure of the encoder to properly encode or transmit timing track data correctly, leading to a corruption of the pseudorandom sequence data which may sometimes be undetectable, or less quickly detectable, by other means.

Also input to mode control state machine 102 is a signal from a power up reset circuit 114 coupled thereto. A reset pulse is input to the state machine during, for instance, power up or upon detecting a momentary dip in the voltage supply. Power up reset circuit 114 can be embodied in a dedicated supply voltage supervisor device, which generates the reset pulse, or the function may be included within other circuits, logic or hardware chosen to implement the decoder. As examples, this function can be included within a complex PLD (programmable logic device), a gate array, an ASIC, or a processor.

A further input to mode control state machine 102 is the output of oscillator 116, which may be a dedicated module, or it may take the form of a quartz crystal, ceramic resonator, or R/C network working in conjunction with a portion of the main circuit. The frequency of the oscillator 116 should be chosen to be considerably higher than the maximum expected or specified quadrature state rate read from the sine and cosine encoder channels, 103 and 105, respectively. Further, it should also be selected to minimize chase time during a tag search operation of the decoder, while otherwise maintaining reliable operations with the specific digital technology selected to implement the decoder.

For example, if it so happens that the monitored motion axis is already traversing at high speed, and the direction of motion happens to coincide with the effective direction of motion the bidirectional synthesizer is designed to search in during the initialization procedure, then the synthesizer will be attempting to overtake the motion axis with a virtual "velocity" determined by the oscillator frequency divided by the number of cycles the control logic's design requires to increment the synthesizer, test for equality, and decide whether or not to change operating modes of the decoder. (Fortunately, this velocity is not accompanied by momentum or inertia, so an instantaneous change in it, or in its direction, can be accomplished to begin tracking the motion axis, when the initial match is ultimately found). Thus, an oscillator frequency that minimizes chase time, while maintaining reliable operations should be selected.

Some of the inputs to the mode control state machine 102 include bus control signals 118 from, for instance, a microprocessor. Mode control state machine 102 manages output bus control and timing, via control signals H/F (hold/follow) 160 and OE (output enable) 162, to ensure coherent data words are issued from buffer/latch 112 even when up/down counter 110 is cycling.

Another output of mode control state machine 102 is status signal 156. The status signal indicates either data valid or data invalid conditions. As one example, the data valid condition is represented by a predetermined logic level and is reported when the decoder is in synchronization with the encoder, as described below. Previous to synchronization, or if synchronization is interrupted, a data invalid condition is reported by issuing the logic level complementary to that chosen to represent data valid.

Various other outputs are generated from mode control state machine 102, which will be described with reference to the other components of the decoder.

Coupled to mode control state machine 102 is N bit code tag accumulator 104, which is used to accumulate index bits read from the index track of the encoder coupled to the decoder. In one embodiment, N bit code tag accumulator 104 includes the functions of an N bit bidirectional shift register, which receives index bits at its left or right shift inputs, and steering logic used to jam an index bit into any flip-flop of the register without disturbing the contents of the other flip-flops.

In particular, the current index (code tag) bit provided by index channel 120 is steered to the flip-flop in the correct bit position of the accumulator during all operational modes of the decoder, and for any frequency and spacing of direction reversals using a bit select address 122, which provides the address of the appropriate flip-flop to receive the bit; a jam control signal 124, which is used to jam the bit without shifting, when appropriate; a clock signal 126, which regulates the appropriate timing to coordinate the actions of tag accumulator 104 with other components of the decoder; and a direction signal 128, which controls shift direction. Bit select address 122, jam control signal 124, clock signal 126 and direction signal 128 are provided by mode control state machine 102.

N bit code tag accumulator 104 is coupled to N bit bus comparator 106, which is used to detect and report equality (signal 130) between an accumulated pseudorandom sequence tag of N bit code tag accumulator 104 and a synthesized code tag generated by bidirectional chain code synthesizer 108, which is also coupled to N bit bus comparator 106.

Bidirectional chain code synthesizer 108 receives as input a reset signal 132, a clock signal 134 and a direction signal 136, all determined and output from mode control state machine 102. The output of bidirectional chain code synthesizer 108 is a synthesized code tag that is input to comparator 106 and compared with the accumulated tag of accumulator 104, as described in further detail herein.

In one embodiment, bidirectional chain code synthesizer 108 includes an N bit bidirectional shifter 140, a feed forward network 142, a feed reverse network 144, and combinatorial exception logic 146, each of which is described in detail below with reference to FIGS. 1 and 2.

Figure 2:
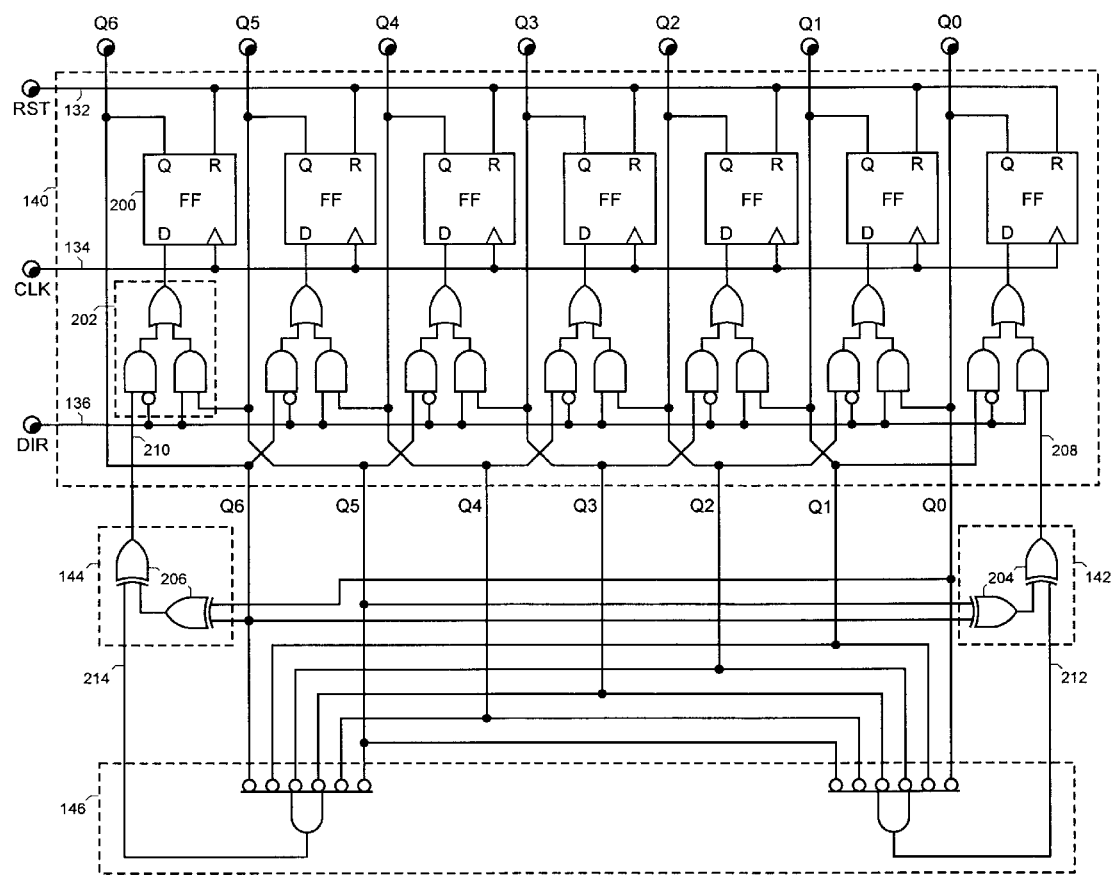
FIG. 2 is a schematic depicting one example of a 7 bit bidirectional chain code synthesizer, in accordance with the principles of the present invention.

Referring to FIG. 2, N bit bidirectional shifter 140 provides, at its output, bits of a pseudorandom sequence. Shifter 140 includes, for instance, N flip-flops 200 and N combinatorial data selector switching circuits 202, each including two AND gates, an inverter (symbolized by the bubble at the input of one of the AND's), and an OR gate. The OR gate, which is the data selector output, drives the D input of its associated flip-flop. Each flip-flop 200 also receives, as input, reset signal 132 and clock signal 134, and provides a Q output (e.g., Q0–Q6).

In order to implement the functions of bidirectional shift register 140, each data selector 202 receives as input shift direction control signal 136 and two data inputs. Interior data selectors 202 associated with flip-flops 200 having outputs Q1–Q5 select between the outputs of their immediately preceding and following flip-flops. Exterior flip-flops 200 having outputs Q0 and Q6 select between the output of their adjacent flip-flops and shift left (forward) data input 208, and shift right (reverse) data input 210, respectively. Thus, bidirectional shifting capabilities are supported.

In this example, N equals 7. Thus, seven output bits in parallel provide the currently synthesized code tag of the pseudorandom sequence. The sequence may include up to 128 unique tags provided, as is the particular case shown here, feed forward network 142 and feed reverse network 144 work together with shifter 140 to implement an m-sequence, and exception logic 146 enables the uniform bidirectional inclusion of that m-sequence's conventionally disallowed tag.

Coupled to shifter 140 are feed forward network 142 and feed reverse network 144. Feed forward network 142 includes exclusive-OR (XOR) gates 204, and similarly, feed reverse network 144 includes XOR gates 206. Feed forward network 142 and feed reverse network 144 produce the next code bit of the pseudorandom sequence for their respective cycling directions based on selected outputs, sometimes called "taps", from shift register 140. The output of feed forward network 142 drives shift left (forward) data input 208. Likewise, the output of feed reverse network 144 drives shift right (reverse) data input 210 of shifter 140.

Coupled to feed forward network 142 via output 212, and to feed reverse network 144 via output 214, is combinatorial exception logic 146. Combinatorial exception logic 146 modifies the action of the feed forward and feed reverse networks, 142 and 144 respectively, to tailor sequences for practical use, in accordance with the principles of the present invention.

Without combinatorial exception logic 146, the feed forward and feed reverse networks are already capable of implementing m-sequences of length $2^N-1$. In an m-sequence, the bit left out is usually a zero, and the missing N bit tag is the string of all N zeroes (though XNOR feed logic of inverted sense will render a string of N ones the disallowed state). That is, conventionally, a register filled with all zeroes inputting to the taps of the feed forward or feed reverse networks would lock the chain code synthesizer into the all zeroes state.

However, as previously mentioned, it is often useful to have the full complement of $2^N$ consecutive code states available for position encoding. Therefore, combinatorial exception logic 146 is added, in accordance with the principles of the present invention, to detect at the parallel outputs of the shifter that N bit code state immediately preceding the all zeroes state (i.e., all zeroes but one), and to invert the bit submitted to the shift forward data input 208 of the shifter 140 with the help of one additional XOR gate in the feed forward network that would not be needed otherwise. The disallowed code state can also be entered from the reverse direction, provided exception logic 146 is in place to detect the immediately preceding state (the lone one is at the other end of shifter 140 this time) and to invert the bit presented by the feed reverse network 144 to the shift reverse data input 210.

For example, in the table of chain code tags of a pseudorandom sequence provided in FIG. 3, each seven bit binary code is listed in the order in which it occurs, with position (POS) 127 considered to be immediately preceding position 000 so that the sequence makes a closed loop. In accordance with the principles of the invention, code tag "0000000" of position 000 has been inserted into a standard seven bit m-sequence with the help of exception logic 146 in order to complete the $2^N$ "natural" resolution of the chain code sequence.

When the tag "1000000" of position 127 is detected, the exception logic causes the feed forward network to enter a "0" at the right during forward synthesis, rather than the naturally occurring "1" of the m-sequence, at the next clock. Thus, the code tag state "0000000" of position 000 is entered. To now exit this state while continuing in the same direction, the exception logic also detects the tag "0000000" of position 000 and enters a "1" at the right on the next clock, rather than the naturally occurring "0" of the m-sequence logic. Therefore, the exception logic to both enter and exit the all zeroes state while shifting left (synthesizing in the forward direction) can be combined to read "X000000", where "X" means the exception logic 146 "doesn't care" which logic level is present, so long as all of the rest are zeroes.

Similarly, when code tag "0000001" of position 001 is detected, exception logic 146 causes the feed reverse network 144 to enter a "0" at the left, rather than the naturally occurring "1" of the m-sequence logic for reverse synthesis, on the next clock. To exit the "0000000" state of position 000 so enforced, proceeding in the same direction, exception logic 146 modifies the action of feed reverse network 144 to present a "1" at the left, rather than the naturally occurring "0", so as to cycle to the "1000000" tag of position 127. The exception logic for reverse synthesis to enter and exit the all zeroes state can thus be combined to read "000000X".

To the right of each tag in the table of FIG. 3 is listed the number of tags that can be "pinched" (PIN) from the sequence, if the next bit entering from the right is inverted from its normal value. For example, if the code tag of position 069 is shifted left one position, and a "0" is entered from the right, rather than the "1", which would naturally occur, then the modified tag "1001100" of position 108 will occur next, thus skipping the 38 tags in positions 070–107. Keeping this in mind, notice that by starting with the tag "1001100" of position 108, by shifting right one position, and entering a "0" from the left instead of the "1" that would naturally occur, the same 38 tags of positions 107–070 are pinched when moving backward through the sequence.

In the above examples, a printed table is used to assist in designing the exception logic. In this case, the table is of a convenient size, because of the modest resolution of the decoder selected as an example. However, for larger values of N, it is more convenient to write and use a computerized utility program to automate the process of including the disallowed m-sequence state and/or pinching the code sequence to obtain the desired resolution. In cases where more than one pinch is required to subtract the desired number of states from the sequence, the pinched segments are selected so as to prevent them from intersecting, else this will introduce ambiguity in the code sequence through multiple occurrences of the same chain code tag within the final sequence.

Returning to FIG. 1, in addition to the above, the decoder includes up/down counter 110. In one example, up/down counter 110 is an N+2 bit up/down counter that shows how two additional least significant bits can be used to report the resolution obtained from the sine/cosine quadrature states issued by the encoder when a timing ratio of 4:1 has been implemented. A clocking edge issued to the counter, via clock signal 152, increments or decrements (depending on direction signal 154) a binary weight equivalent to one quarter the angular or linear displacement value of the chain encoded disk or scale position. Therefore, starting from its reset position (provided by reset signal 150), the up/down counter generally records four times the number of clocks issued to the chain code synthesizer, which effects a match at the bus comparator between synthesized and acquired chain code tags, plus as many as three more clocks to identify the quadrature position within the cycle.

Alternatively, mode control state machine 102 can concatenate two Gray-to-binary parallel decoded LSB's (least significant bits) with the counter output. If a 2:1 spatial timing ratio has been selected, only one additional LSB bit need be incorporated into the counter, or concatenated with it. If a 1:1 ratio has been selected, no additional bits need to be handled. Note also that when the chosen pseudorandom sequence is tailored to have other than a natural $2^N$ sequence length, the up/down absolute position counter is specially constructed to overflow and underflow in sympathy with it. Since the art of designing counters having different moduli is well known, this is not described further herein.

Coupled to up/down counter 110 is buffer/latch 112. In one embodiment, the buffer/latch is used to keep the data output from changing while it is being read by the user, even though up/down counter 110 may be cycling to track encoder motion reported to the decoder. Mode control state machine 102 intervenes between the user's requests for data, as seen at the bus control inputs 118, and the actual updating of latch 112 to achieve this goal, as well as implementing tri-state outputs, if desired.

Alternatively, the output may be converted to Gray code, which is not an uncommon data transmission code in conventional absolute encoder applications. With suitable internal timing precautions taken within the decoder itself, the data output can "freewheel" without the need for handshaking control lines. This may be preferred in cases where the final resolution is modest and the end user is more comfortable with such schemes.

The decoder's output coding can be natural binary, binary coded decimal, or Gray code, and data transmission can be any kind of buffered or unbuffered parallel, or synchronous or asynchronous serial, format without departing from the spirit of the present invention. The parallel natural binary bus compatible data output shown is only one example which may be convenient for a range of applications.

The output of buffer/latch 112 in the example embodiment of FIG. 1 consists of the absolute position of the N bit code tag read from the encoder, plus 2 quadrature derived position bits, plus status bit 156. Although status bit 156 is shown routed through the N+3 bit output buffer, it may bypass it and be wired directly to an interrupt request line going to a microprocessor, to a visual status indicator, or some other circuit requiring different treatment than the N+2 bit binary output data.

Decoder status output 156 used to indicate the validity of the absolute position output word can be in any usable format. Such formats include, but are not limited to, an unbuffered signal suitable for direct wiring to an interrupt request line going to a microprocessor, a buffered signal grouped and transmitted with the data signals, a visual status indicator, such as a light emitting diode, a signal which already transmits parity for the position output word and is deliberately falsified, or not, to embed the status information, a resetting of the absolute position output word to a value which is known to be invalid for the resolution selected, or any combination of the above, without departing from the spirit of the present invention.

The status output 156 indicates that the absolute position output is valid only when the decoder is operating in track mode. When the decoder is in wait and search modes, the status output indicates that the current position output is invalid. Wait, search, and track modes are described in greater detail below.

Figure 4:
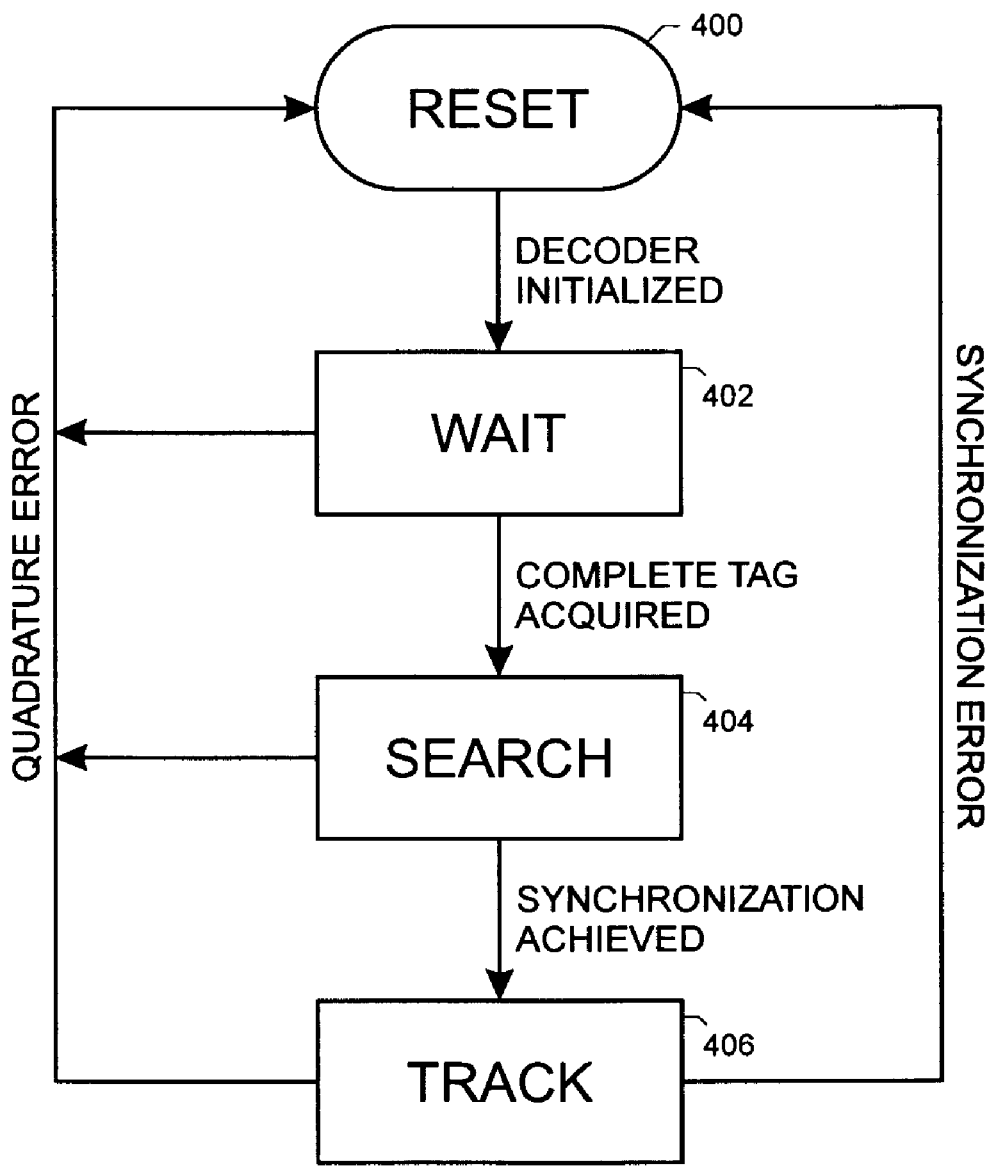
FIG. 4 is a flowchart depicting one example of the general operating modes of the decoder of FIG. 1, in accordance with the principles of the present invention.

Referring to FIG. 4, reset STEP 400, is actually a non-operating condition (not an operating mode), which is normally enforced only momentarily and is the starting point of the flowchart. During a reset, all of the registers, counters, and other sequential logic circuits of the decoder are placed in known operating conditions (e.g., set to zero or initialized to some other predefined value).

A reset may occur when mode control state machine 102 receives a "hard" reset signal from power up reset circuit 114. This will result from a power interruption or momentary dip below the sensing threshold of the supply supervisor or other hardware resource dedicated to monitoring the decoder's supply voltage quality.

A "soft" reset, where the decoder decides to reset itself in an attempt to return to correct operation, may occur due to failure of the decoder to maintain synchronization between accumulated and synthesized pseudorandom tags, which are continually compared while the decoder is in track mode. Failures leading to loss of synchronization may come about from a corruption of any of the encoder signals due to damage or fouling of its tracks, failure of its track sensing means, or broken or intermittent encoder power or data transmission wires.

A soft reset may also occur due to the detection of a disallowed quadrature state transition in the encoder timing track signals, even if such transition does not immediately affect the chain code data from the index track. Soft resets may also result from an overwhelming electromagnetic interference which might produce the effect of any of the other causes mentioned.

Optionally, a reset may also be effected by an overriding control input from the host system (not explicitly diagrammed in FIG. 1).

When reset is deasserted, the decoder transitions to wait mode, STEP 402. In wait mode, the decoder accumulates chain code bits of the encoded pseudorandom sequence until its control logic 102 is satisfied that a complete code tag exists in accumulator 104. In particular, the decoder stays in wait mode until the encoder traverses a sufficient number of positions for the decoder to read N bits of the pseudorandom sequence into the accumulator from the encoder's indexing track. This will take an indeterminate amount of time, since it depends on a physical motion of the encoder.

In accordance with the principles of the present invention, only one index channel 120 is input to tag accumulator 104. Mode control state machine 102 determines where the bit received from the index channel is to be placed in the accumulator.

Figure 5:
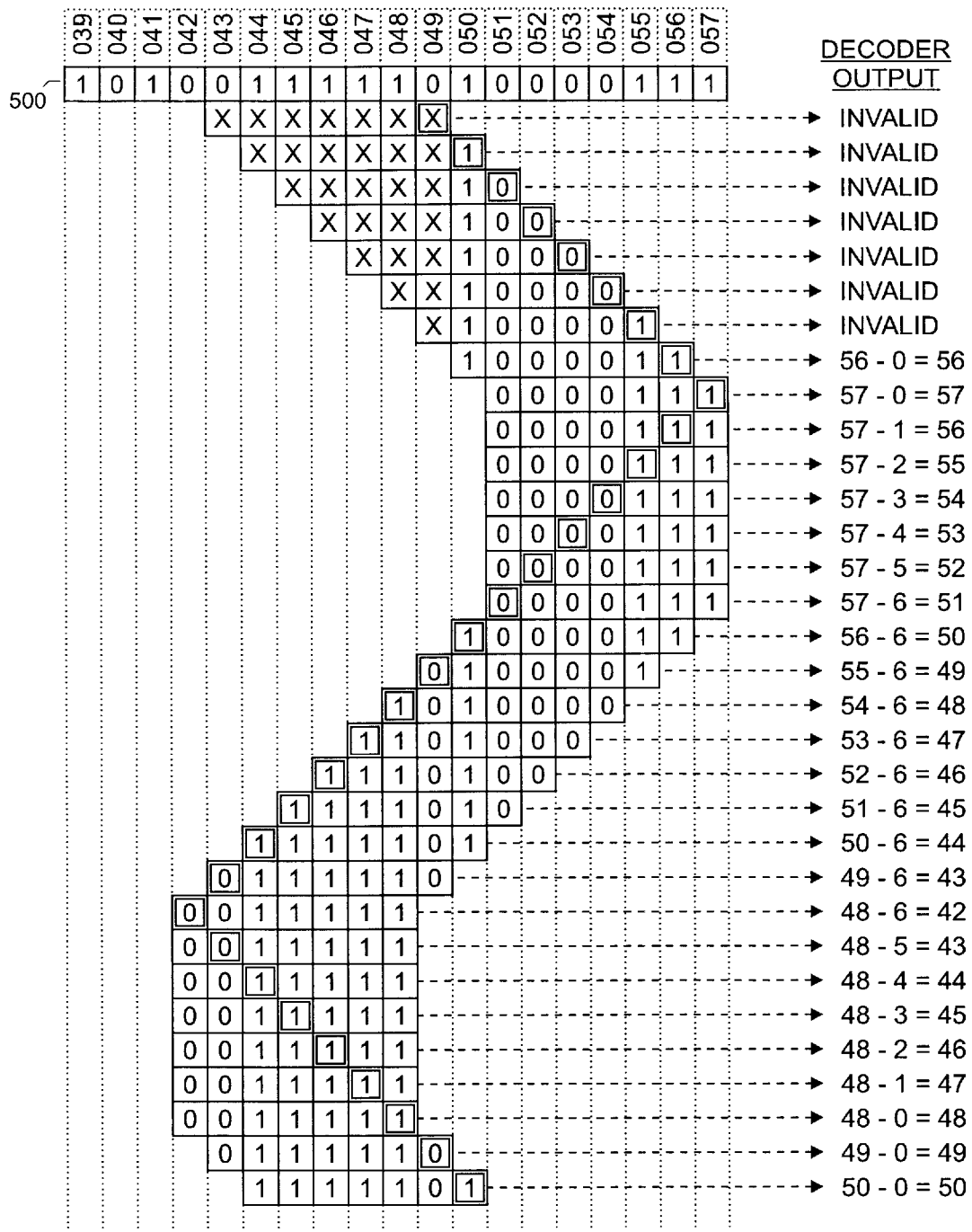
FIG. 5 is a graph depicting one example of how a 7 bit code tag is initially accumulated and further maintained for decoding, using the principles of the present invention.

Referring to FIG. 5, a short segment 500 of the pseudorandom code from the table of FIG. 3 is listed across the top of the figure. This represents a piece of the encoder's chain encoded track which happens to be in the local neighborhood of the encoder's index detector, and is therefore subject to being read into the decoder's tag accumulator during and immediately following an initialization traverse. Above each bit position of the segment is a three digit number which gives the absolute position (POS) of the code tag whose rightmost bit is directly below it, and whose remaining six bits trail to the left. For example, absolute position 057 corresponds to a seven bit tag "10000111" occupying bit positions 051 through 057.

Directly below the featured code segment, and descending downwards, is a graphical history of an encoder motion to the right, then backwards, and then forwards again to the approximate starting position. On each line, a set of seven contiguous boxes represents the seven bit accumulator of a decoder designed in accordance with the principles of the present invention. Inside the boxes, which are the flip-flops of the accumulator, ones and zeroes represent their conventional logic values. The X's symbolize residual logic values which are unlikely to agree with the bits of the code segment above, since they are whatever happened to be in the accumulator after a reset, not the result of reading the encoder's disk or scale.

The highlighted box on each line symbolizes the code bit which is currently being transmitted from the encoder to the decoder via index channel 120. It may also be thought of as the index window aperture through which the pseudorandom code track is being viewed by its single index sensor.

On the first line, no bit position of tag accumulator 104 has valid data. This is only because it is timing signals sine 103, and cosine 105, have not yet arrived at that quadrature transition which controls the timing of the sample of the pseudorandom (index) track signal. However, as shown on the second line down, after a very small motion rightward, a sampling transition is encountered, and the "1" of position 050 is shifted into the accumulator from the right by a left shift. Mode control logic 102, which determines a left shift is the appropriate method of steering the index bit into place based on direction sensing the timing signals by conventional quadrature decoding techniques, notes this event and increments a valid bit counter (or shifter, or some other sequential circuit) to signify that one bit position of the accumulator is now valid.

Another counter (or shifter, or some other sequential circuit) in the control logic remains undisturbed by this operation, because it was zeroed during the reset STEP 400 to "point to" the least significant (rightmost) flip-flop of the accumulator. Since the highlighted box, or "active" bit position of the accumulator remains the rightmost position after a left shift, there is no need to modify the contents of what shall be named, for the sake of simplifying further discussion, an offset counter.

Continuing rightward motion of the encoder's read station relative to its scale or disk causes further sampling transitions from the timing track, enters code bits from the index channel at the right of the tag accumulator by left shifts, increments the valid bit counter, and does not cause any change in the zero value of the offset counter. However, when the valid bit counter attains a full count of seven, in this example, a complete tag is available for decoding and the mode control state machine 102 transitions the decoder out of wait mode STEP 402 into search mode STEP 404.

The above description is one example of the simplest method of initializing, by a unidirectional motion, the accumulator register 104 of a decoder designed in accordance with the principles of the present invention. In another case of this example, a uniform motion of the read station traversing leftward over the scale or disk of the encoder, sufficiently far to read in seven bits of the pseudorandom code, is also effective, but causes somewhat different behavior in the control logic, accumulator, valid bit counter, and offset counter.

In particular, each new bit of the pseudorandom code is jammed into the next leftward flip-flop of the accumulator, starting from the rightmost position. Only when all seven positions are filled with valid code bits, and the offset counter has reached its corresponding maximum value of six, will further leftward motion of the encoder cause the mode control logic to steer new data to the left side shift input for right shifting. This sort of accumulator behavior can be seen, even though the accumulator is already fully initialized with a complete code tag, in the leftward motion starting on the tenth line down of the graph of FIG. 5, and just beginning to right shift new data starting at line sixteen.

Similarly, bidirectional "wiggles" during the initialization traverse will cause new bits to be shifted in from the right when the current offset is zero and motion is rightward, shifted in from the left when the current offset is six and motion is leftward, in this example, and written into intermediate positions of the accumulator for all other combinations of motions and offsets. It is by this method that the net initialization traverse of the encoder is limited to N code bits, regardless of the direction of motion.

Various details are provided for in the design of the control logic 102 to implement this scheme. For example, the valid bit counter is designed to avoid overflowing when its maximum count is reached, it is responsive to the acquisition of new bits of the chain code regardless of direction of motion, and it does not count valid bits twice when direction reversals occur. Likewise, the offset counter does not underflow its minimum value, or overflow its maximum, in order to maintain a correct value for further uses. Further, it is preferable that a testing function to detect disallowed quadrature state transitions be included in the quadrature decoder circuit and that it be continuously active in the background during the entire wait mode duration. Quadrature decoding and disallowed state detection are well known, and will not be described further herein.

The above description should be considered exemplary only. Many symmetries in the definitions of the various physical motions, register shifts, logic levels, arithmetic operators, and position labels suggest that a decoder using an accumulator register and one pseudorandom code input channel may be designed which appears different in construction, yet operates by essentially the same principles outlined herein. The chief algorithm presented here is that an offset corresponding to the active bit position within the accumulator may be used to adjust the output position value of the decoder. This compensates for an N bit physical hysteresis in the acquisition of code tags from bidirectional encoder motion in the absence of a redundant indexing sensor which would otherwise simply provide a fresh code tag for decoding with each increment of motion, either forward or backward, at all times after system initialization. Methods for using the offset value to adjust the decoder's position output will be explored later in conjunction with the explanation of the decoder's track mode of operation.

Returning to FIG. 4, subsequent to acquiring a complete initial code tag, the decoder transitions into search mode, STEP 404. Previous to obtaining a complete tag for decoding, most of the decoder's capabilities are idle while it waits for the initial tag. In search mode, bidirectional chain code synthesizer 108 of FIG. 1 synthesizes chain codes of a pseudorandom sequence until there is a match between the accumulated initial code tag and the synthesized tag. The number of increments used to complete the tag search by finding the match is the absolute position output.

The length of time the decoder is in search mode depends on the specific design of the decoder, the frequency at which it is clocked, the actual position of the disk or scale with respect to the starting point of the tag search in the code sequence, and the speed and direction of the encoder's disk or scale during the search period.

Figure 6:
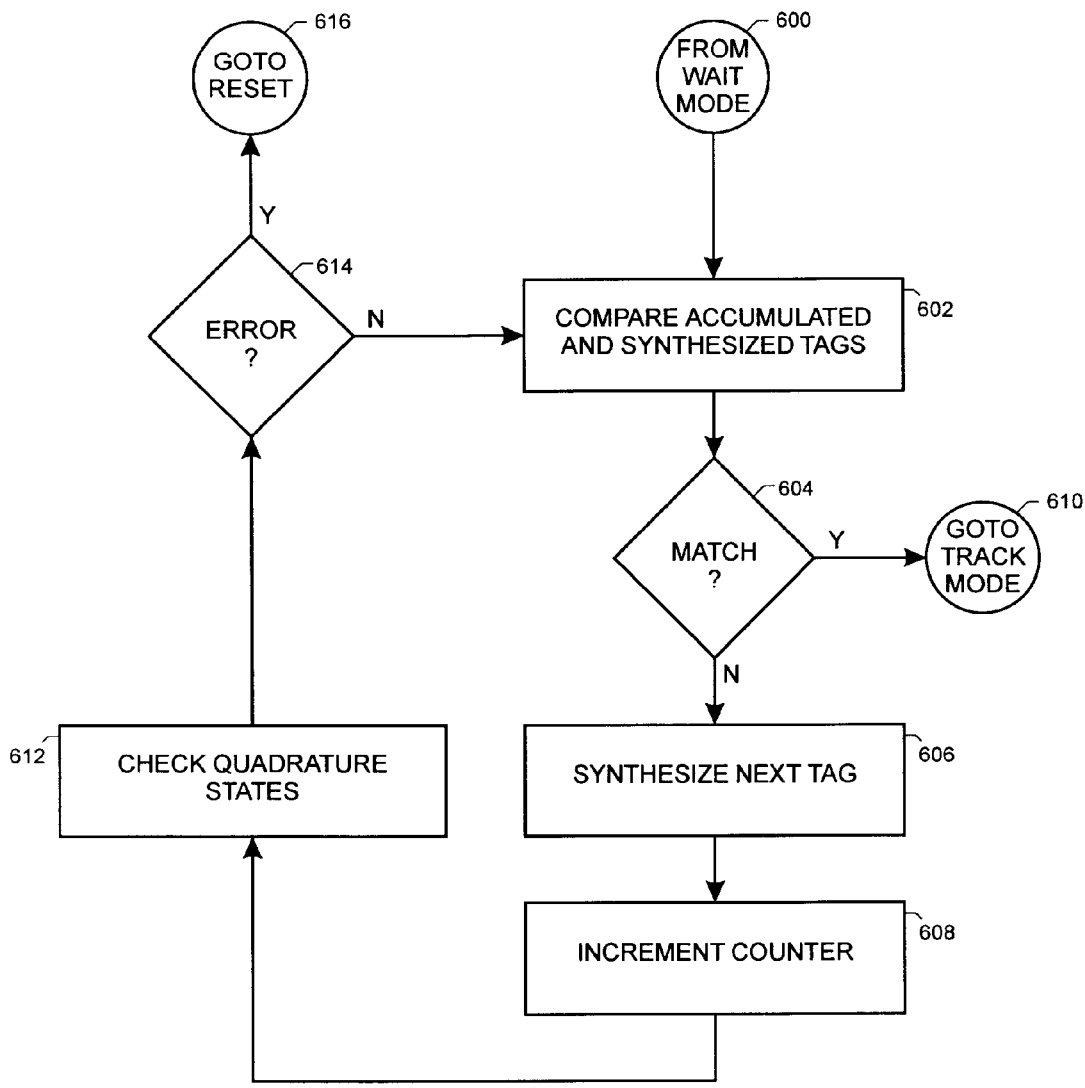
FIG. 6 is a flowchart depicting one embodiment of the logic associated with the search operating mode of the decoder, in accordance with the principles of the present invention.

One embodiment of the operations that take place during search mode is further described with reference to FIG. 6. Bidirectional chain code synthesizer 108 was previously initialized by a hard or soft reset, STEP 400 of FIG. 4 to a beginning tag. For example, if N=7, then the beginning code may be "0000000" as in the example of position zero in the table of FIG. 3. Additionally, up/down position counter 110, which is clocked in synchronism in some ratio with synthesizer 108 as already described in reference to acceptable timing ratios, is also initialized to a beginning position (e.g., zero), although in some embodiments of the present invention, its value may already have been directly adjusted by an offset during wait mode, prior to the beginning of the tag search.

The initial tag of the synthesizer is compared to the tag stored in accumulator 104 using bus comparator 106, STEP 602. If the two tags are unequal, INQUIRY 604, as is usual since the decoder's first "guess" about the position of the encoder has a very low probability of being right, bidirectional code tag synthesizer 108 generates a new synthesized tag in the forward direction using, for example, the circuits depicted in FIG. 2, STEP 606. In addition, the up/down counter is incremented, STEP 608.

At this point, it is worth emphasizing that choosing the direction of code tag synthesis to be forward rather than reverse, and choosing to increment rather than decrement the output position counter, has nothing to do with the direction of encoder motion during the tag search mode of operation of the decoder. It is not the purpose of the tag search to accumulate counts from the timing track of the encoder, as would a simple incremental encoder system, but to identify the numerical position within the pseudorandom sequence of the code tag acquired from the encoder. Since this is done by counting the guesses taken to find a match, it does not matter, strictly speaking, which direction of synthesis and counting is pursued. Synthesizing and/or counting backward will work just as well. So long as the starting counter value and first code tag of the synthesizer are always the same at the beginning of every tag search, the position of each tag of the encoder will correspond to an absolutely identified location of its disk or scale, and so the requirement that the encoder behave absolutely will be fully satisfied.

Testing for disallowed quadrature state transitions, STEP 612, may, in some embodiments of the present invention, take place in the background, if hardware resources are dedicated to this task. FIG. 6 shows how this function may instead be included in the basic execution loop of the tag search mode to provide full protection against this error source when the decoder is implemented fully, or in part, in the form of a serially executed software program. Upon detection of a disallowed state transition, INQUIRY 614 will cause a soft reset of the decoder in an attempt to resume correct system operation. If no error is discovered, bus comparator 106 equality output 130 will be tested again, STEP 602.

The above procedure continues until INQUIRY 604 indicates a match between the synthesized tag and the accumulated tag. When a match is found, search mode is complete, track mode is entered, CONNECTOR 610, and up/down counter 110 indicates the absolute position of the accumulated tag.

Returning again to FIG. 4, when synchronization is achieved, the decoder transitions to track mode, STEP 406. The intent of track mode is to follow the motions of the encoder and to ensure that the encoder and the decoder stay in synchronization. Unless an error is detected in the operation of the encoder/decoder system, the decoder remains in track mode until operating supply power is removed.

While the detection of an error in the timing track signals (a disallowed state transition) may cause the decoder to reset out of any decoder operating mode, and transition back to wait mode in an initialized state, a synchronization error is detectable only when the decoder is in track mode, and only while in track mode does the decoder report its output data to be valid via its status output means, signal 156 of FIG. 1.

Figure 7:
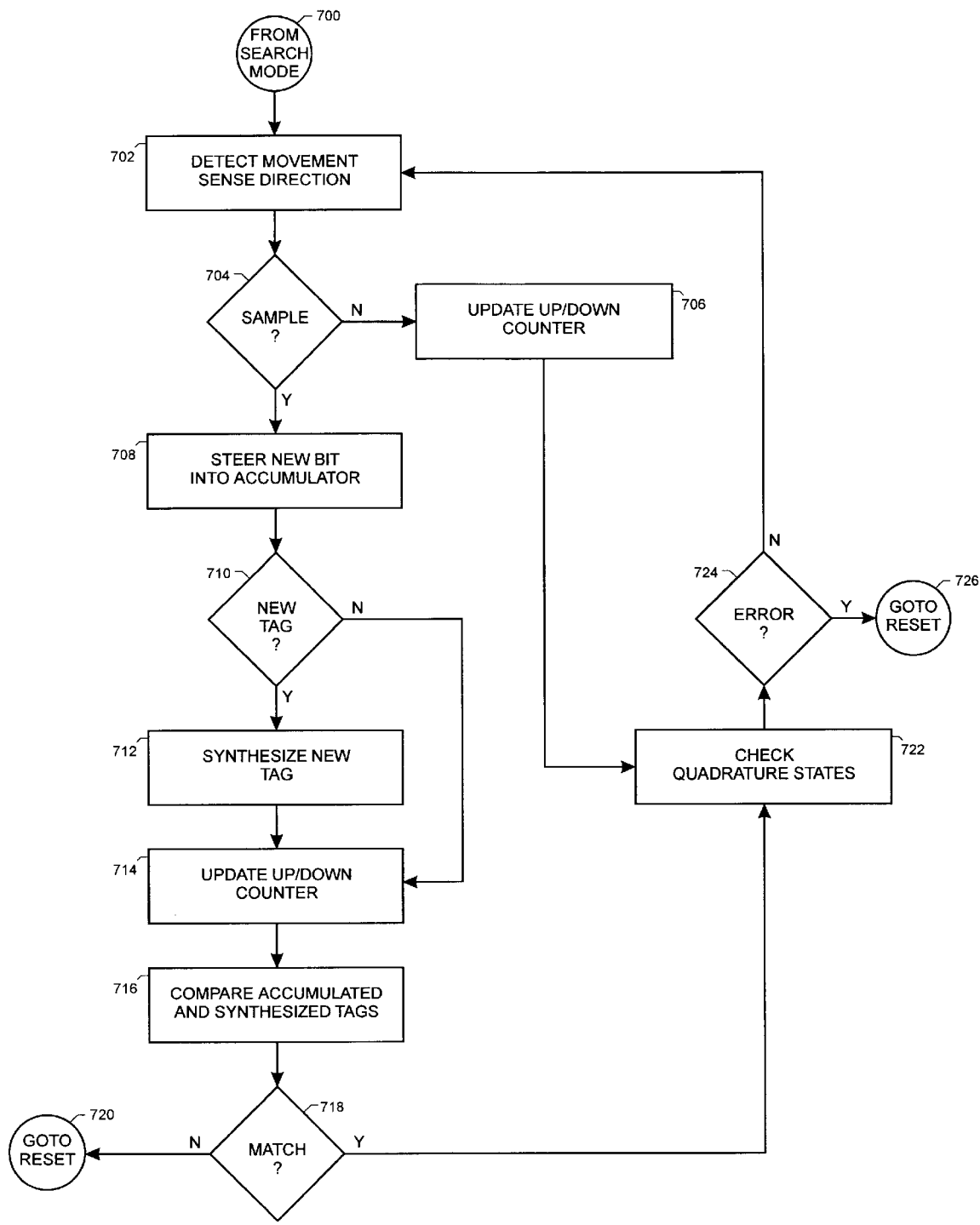
FIG. 7 is a flowchart depicting one embodiment of the logic associated with the track operating mode of the decoder, in accordance with the principles of the present invention.

One embodiment of the logic associated with track mode is depicted in FIG. 7 and described in detail herein. Initially, the decoder detects movement by the encoder, STEP 702. For example, a quadrature decoder located in mode control state machine 102 detects a state transition on the incremental timing signals of the encoder, indicating that movement has occurred, and samples the index track signal 120. In accordance with the graph of FIG. 5, any movement by the encoder is observable either in the contents of the code tag accumulator 104 or its offset value maintained in state machine 102.

When movement is detected, the mode control state machine determines what direction it is in, STEP 702. Next it determines if the encoder motion caused a quadrature transition at which a sample of the index signal is taken, or if one of the other quadrature transitions (in systems utilizing 2:1 or 4:1 timing ratios) has occurred, INQUIRY 704, which only calls for updating the lesser significant bits of the up/down counter, STEP 706. If a sampling transition has occurred, the state machine determines where to steer the new code bit into the accumulator, STEP 708, based on direction of motion and the status of the offset counter, as mentioned previously. If the new bit is shifted in from the left or right, thus creating a new tag in the accumulator, INQUIRY 710, then the state machine directs the bidirectional code tag synthesizer to generate a new code tag in the forward or reverse direction to mimic the behavior of the accumulator, STEP 712, and update the output position counter in the same direction, STEP 714.

If INQUIRY 710 does not detect a new tag in the accumulator, but only a change in the value of the offset counter in the mode control state machine, then the up/down counter is updated directly via STEP 714, without synthesizing a new tag. In STEP 716, the synthesized and accumulated tags are compared by bus comparator 106, and equality signal 130 is examined by INQUIRY 718 to determine if synchronization has been maintained by the previous procedure.

It is important to note that, during track mode STEP 406, when a "renewed" code bit read from the encoder contradicts the previously recorded logic value in the accumulator for that encoder position (due to noise interference, for example) it is still used to overwrite the affected accumulator bit position in STEP 708. However, the bus comparator monitoring the status of both the acquired and synthesized code tags as a whole will indicate the two N bit words are no longer equal, though only one bit of the acquired tag has been corrupted and therefore no longer matches its counterpart in the synthesized tag. The state machine quite properly interprets this loss of equality as a failure to maintain synchronization between the physical encoder position and the electronic "image" of it created inside the decoder by the bidirectional chain code synthesizer circuit. Therefore the decoder resets via CONNECTOR 720, and thereafter reverts to wait mode STEP 402 in order to obtain a fresh code tag.

It should be apparent at this point in the tutorial of the present invention that corresponding new bits are required to be generated in the synthesizer circuit whenever the tag accumulator is shifting newly acquired data in from either direction of motion, and that even during direction reversals which overwrite existing bit positions in the accumulator with renewing data, equality with previously synthesized bits is still maintained. Therefore it follows that each and every new chain code bit detected and reported by the encoder is compared with one that the decoder expects it to match. Once the overall encoder/decoder system has been synchronized, this testing process continues unabated, save for power down or a reset of the decoder. Additionally, any failure to maintain on-going synchronization of the physical chain code with the electronically synthesized chain code is immediately reported to subsequent circuits by means of an output signal (e.g., status signal 156) indicating a data invalid condition.

Testing for disallowed quadrature state transitions, STEP 722, may, in some embodiments of the present invention, take place in the background, if hardware resources are dedicated to this task. FIG. 7 shows how this function may instead be included in the basic execution loop of the track mode to provide full protection against this error source when the decoder is implemented fully, or in part, in the form of a serially executed software program. Upon detection of a disallowed state transition, INQUIRY 724 will cause a soft reset of the decoder via CONNECTOR 726 in an attempt to resume correct system operation.

In the embodiment described above, the up/down counter is being updated at STEP 706, even if the synthesizer is not generating any new tags. In another embodiment, the up/down counter is not incremented or decremented at this time, but instead, the offset (active bit position within the accumulator) is subtracted from the absolute position counter output with the help of a dedicated arithmetic circuit or program subroutine.

To reiterate, track mode starts as soon as synchronization has been achieved. Further motion in the same direction beyond that required to initialize the accumulator register causes new code tag bits to enter its left or right shift data input, as the case may be. Assuming no malfunction has occurred, any subsequent direction reversal causes existing code tag bits to overwrite already filled bit positions in the accumulator with matching data. An offsetting number of counts is incremented or decremented from the up/down position counter, but not the bidirectional chain code synthesizer, in response to any relative "internal" motion not large enough to cause the code tag accumulator to shift left or right.

Described in detail above is one example of a decoder that accepts as input N bit chain code tags of a pseudorandom sequence, and produces as output absolute positions of the N bit chain codes. The decoder includes a bidirectional chain code synthesizer that is capable of synthesizing pseudorandom sequences having a resolution of $2^N$.

One example of a Hardware Description Language listing used to implement a 7 bit decoder, in accordance with the principles of the present invention, is depicted in FIGS. 8a–8d. This listing is an AHDL listing in a format defined by the Altera Corporation, a vendor of PLD's suitable for implementing the present invention.

The first section (FIGS. 8a–8b) defines the inputs, outputs, state variables and signals for a programmable logic device. The section labeled "SUBDESIGN demo512" (FIG. 8a) defines the inputs and outputs. The section labeled "VARIABLE" assigns flip-flops to state variables and uses descriptive names to improve readability.

The second section is the seven bit code tag accumulator (FIG. 8b). The code tag read from the encoder is stored in a variable called "IndexData". The signal called "INDEX_IN" is the value of the index bit coming from the encoder's chain code track. The "Shift", "ShiftLeft" and "ShiftRight" signals control the shift function of the accumulator and the "JamSelect" signals control the insert function.

The third section is the code tag synthesizer circuit (FIG. 8b). It consists of the seven bit bidirectional shifter, the feed forward and feed reverse networks, and the combinatorial exception logic. The variable "SynthData" holds the synthesized code tag. The "TagUp" and "TagDown" signals determine whether the bidirectional shifter shifts left, shifts right, or holds its value. The bidirectional shifter is preset to all zeros by the "Restart" signal.

The next section is the seven bit bus comparator (FIG. 8b). The comparator generates an "InEquality" signal when the synthesized code tag is not equal to the accumulated code tag, or if the code tag accumulator does not contain a complete tag.

The nine bit up/down absolute position counter is defined in the next section (FIG. 8c). The count is stored in the "Position" variable. The "CountUp" and "CountDown" signals determine whether the counter counts up, counts down, or holds its value. The two least significant bits (LSB's) of the counter are determined directly from the quadrature signals on the timing track. The seven most significant bits are determined solely by the "CountUp", "CountDown" and "Restart" signals. The up/down position counter is preset to zero by the "Restart" signal.

The sixth section defines the mode control state machine (FIGS. 8c–8d). It is divided into seven subsections. The first subsection defines some signals to make the logic easier to follow. The second subsection defines the signals derived from the encoder's quadrature timing track. "Mark" and "Gate" are the quadrature signals after they have been synchronized to the decoder's oscillator clock source. "LastMark" and "LastGate" are the delayed versions of these signals.

The third subsection controls overall timing for the system. The "Delay" signal indicates that a new cycle cannot start yet. The "Shift" signal determines when the code tag accumulator shifts in a new index bit. The "Load" signal determines when a new or renewing index bit is jammed in parallel into the code tag accumulator. The "Cnt" signal determines when to increment or decrement the up/down position counter. The "Tag" signal determines when to increment or decrement the bidirectional shifter in the code tag synthesizer circuit. The "Down" signal indicates the direction of the operation. All of these signals are initialized to a logic low by the "RESET_IN" input pin.

The fourth subsection of the mode control state machine is responsible for fault detection. "Restart" is asserted when synchronization is lost or a quadrature error is detected.

"Restart" restarts the code tag accumulation and synchronization processes by initializing the "BitPosition", "ValidBitCounter", bidirectional shifter and up/down position counter. "Restart" is preset to active by the "RESET_IN" input pin.

The fifth subsection of the mode control state machine (FIG. 8d) keeps track of where the next bit should be inserted. Its "BitPosition" counter keeps track of where to insert the next bit within the code tag accumulator. The "JamSelect" signals control when and where to insert a bit into the code tag accumulator. The "FullLeft" and "FullRight" signals indicate when the "BitPosition" counter is a zero or maximum count. The "BitPosition" counter is preset to zero by the "Restart" signal.

The sixth subsection of the mode control state machine detects the presence of a complete initial code tag from the encoder. The variable "ValidBitCounter" contains the number of valid bits in the code tag accumulator. The signal "CompleteTag" is asserted when this number is equal to seven, in this example. The "Restart" signal presets "ValidBitCounter" to zero.

The seventh and last subsection defines the bus control logic. The "DataHold" variable is used to synchronize the "DataHold_IN" input. It controls the "Buffer" register, which is a ten bit output buffer latch providing nine position data bits and the status output bit.

In addition to the above, in which a pseudorandom sequence is generated having a resolution of $2^N$, in accordance with the principles of the present invention, a decoder and, in particular, a bidirectional chain code synthesizer, can be implemented to generate pseudorandom sequences of any arbitrary resolution. In one example, this is accomplished by pinching out any unwanted codes of the sequence.

In particular, the same selective bit inverting capability used by exception logic 146 to help the feed forward and feed reverse networks enforce full $2^N$ length sequences can also be used to pinch groups of code states from a sequence seamlessly, that is, without interfering with the uniqueness of all the remaining N bit tags.

In essence, at each position in the pseudorandom sequence, if a one is substituted for the naturally occurring zero (or vice versa) at the shift register data input of the bidirectional chain code synthesizer just before clocking to the next state, all the code states between that one and the unnatural occurrence of the new state so enforced will simply be skipped. In half of such cases, for each $2^N$ length sequence, the number of skipped states will be greater than or equal to half the total number of states ($2^{N-1}$). These are not so helpful, as implementing a general architecture one bit less wide will be a more resource efficient starting point toward achieving the desired reduction in final encoding resolution, and will also reduce the encoder's initialization traverse by the width of one code bit, as well. However, among the other half of the cases, can be found a combination of one or two pinches that delete the desired number of code states.

Figure 9:
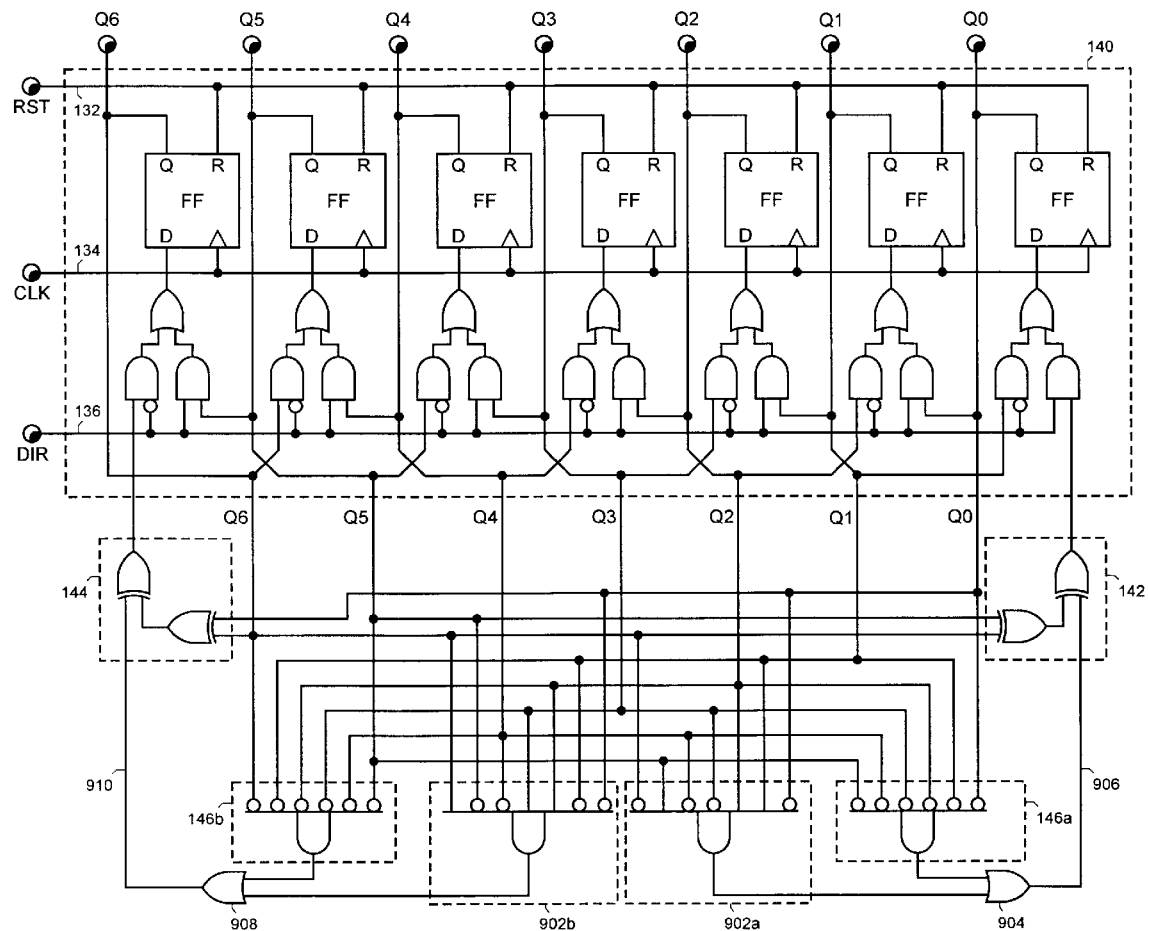
FIG. 9 is a schematic depicting one example of a 7 bit bidirectional chain code synthesizer with exception logic for pinching 38 tags, in accordance with the principles of the present invention.

One example of a bidirectional chain code synthesizer, which has been modified to pinch a plurality of chain code tags from a pseudorandom sequence, is depicted in FIG. 9. Seven bit bidirectional chain code synthesizer 900 has been modified to produce 90 chain code tags. This schematic conforms to the tabular representation of output states previously discussed with reference to FIG. 3. Further, similar to FIG. 2, synthesizer 900 includes the functions of a bidirectional shifter 140 supplying data to the seven bit bus, Q0 through Q6; feed forward network 142; feed reverse network 144; and exception logic 146 (i.e., 146a, 146b in this figure), inserting the all zeroes state to achieve the natural resolution of 128 chain code tags. Synthesizer 900 also includes exception logic 902a, 902b, used to pinch 38 chain codes in one segment from the total sequence to arrive at the desired resolution.

As depicted in FIG. 9, exception logic 902a includes an AND gate receiving, as input, a plurality of selected Q outputs, one or more of which is inverted. The output of exception logic 902a is fed to an OR gate 904, which also receives as input the output of exception logic 146a. The result of the OR function is then input to feed forward network 142 via output 906. Similarly, exception logic 902b includes an AND gate receiving, as input, a plurality of selected Q outputs, one or more of which is inverted. The outputs of exception logic 902b and 146b are fed to an OR gate 908, and the output of OR gate 908 is then forwarded to feed reverse network 144 via output 910. Thus, the two groups of exception logic (146a, 146b and 902a, 902b) are used to add a conventionally disallowed code (e.g., an all zeroes code), and to pinch out unwanted codes to provide a pseudorandom sequence of any arbitrary resolution. (In another embodiment, exception logic 146a, 146b can be removed, while still keeping exception logic similar to 902a, 902b to provide sequences of arbitrary resolutions.)

One example of a Hardware Description Language listing in a format defined by the Altera Corporation, used to implement a 7 bit decoder with 38 tags pinched is depicted in FIGS. 10a–10d. The only difference between the implementation with 512 states, shown in FIGS. 8a–8d, and the one with 360 states, shown in FIGS. 10a–10d, is in the design of the binary position up/down counter and the code tag synthesizer.

The binary absolute position up/down counter includes overflow/underflow logic to limit its maximum count. On count up, an IF statement detects the binary equivalent of eighty-nine in the upper seven bits of the counter and sets the next state to zero. Similarly, another IF statement detects the zero count on count down, and sets the next state of the upper seven bits to eighty nine. With all possible states of the upper seven bits totalling 90, times 4 quadrature derived states from the timing track represented by the two LSB's, 360 counter states are achieved, enabling the example decoder to easily represent angular degrees.

The code tag synthesizer of this example includes two extra terms in the exception logic. The first term detects the state "0110010" during a "TagUp" cycle and causes the next state to be "0011001", instead of "1011001". This change pinches out thirty-eight of the one hundred and twenty-eight possible unique code tags. The second term serves the same purpose for the opposite direction of motion. It detects the state "0011001" during the "CountDown" cycle and sets the next state to "0110010", instead of "0110011", skipping the same thirty-eight code tags.

Described in detail above are $2^N$ bidirectional synthesizers where N equals 7. These are only examples, however. The capabilities of the present invention can be extended to synthesizers whose value for N (the width of the synthesizer's architecture, and the length of the code tag required for unambiguous encoding) does not equal 7, which generate sequences of any arbitrary resolution, including any natural binary resolution or any other resolution, without departing from the spirit of the present invention.

In the examples described herein, the bidirectional chain code synthesizer is included in a decoder used to provide position information. This is only one example, however.

The bidirectional chain code synthesizer and the capabilities of the present invention can be incorporated and used with various other technologies, without departing from the spirit of the present invention.

The digital components of the present invention may be implemented in the form of a programmable logic device, masked or field programmable or reprogrammable gate array, programmable array logic, discrete conventional logic, application specific integrated circuit, software algorithm running on a conventional or reduced instruction set microprocessor, microcontroller, or digital signal processor, or partitioned between software and hardware in any combination of the above-mentioned resources ranging from all hardware to all software or any balance therebetween, without departing from the spirit of the present invention.

The present invention can be included in an article of manufacture (e.g., one or more computer program products) having, for instance, computer useable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just exemplary. There may be many variations to these diagrams or the steps (or operations) described therein without departing from the spirit of the invention. For instance, the steps may be performed in a somewhat differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of synthesizing pseudorandom sequences, said method comprising:
    bidirectionally synthesizing a pseudorandom sequence of a plurality of code tags, said bidirectionally synthesizing comprising at least one of the following:
        including in said pseudorandom sequence a code tag that has conventionally been considered a disallowed code tag; and
        pinching out one or more code tags of said pseudorandom sequence.

2. The method of claim 1, wherein said including in said pseudorandom sequence comprises:
    detecting, during forward synthesis of said pseudorandom sequence, a predetermined code tag of said pseudorandom sequence;
    shifting bits of said predetermined code tag to the left, when said predetermined code tag is detected;
    entering a binary digit at the right of the shifted predetermined code tag, such that the conventionally disallowed code tag is entered; and
    exiting said disallowed code tag.

3. The method of claim 2, wherein said disallowed code tag comprises an all zeroes code tag.

4. The method of claim 3, wherein said predetermined code tag comprises a code tag having a binary one as the leftmost bit and all binary zeroes as the remaining bits.

5. The method of claim 2, wherein said disallowed code tag comprises an all ones code tag.

6. The method of claim 5, wherein said predetermined code tag comprises a code tag having a binary zero as the leftmost bit and all binary ones as the remaining bits.

7. The method of claim 2, wherein said exiting comprises:
    detecting, during forward synthesis of said pseudorandom sequence, said disallowed code tag;
    shifting bits of said disallowed code tag to the left, when said disallowed code tag is detected; and
    entering a binary digit at the right of the shifted disallowed code tag, such that the conventionally disallowed code tag is exited.

8. The method of claim 1, wherein said including in said pseudorandom sequence comprises:
    detecting, during reverse synthesis of said pseudorandom sequence, a predetermined code tag of said pseudorandom sequence;
    shifting bits of said predetermined code tag to the right, when said predetermined code tag is detected;
    entering a binary digit at the left of the shifted predetermined code tag, such that the conventionally disallowed code tag is entered; and
    exiting said disallowed code tag.

9. The method of claim 8, wherein said disallowed code tag comprises an all zeroes code tag.

10. The method of claim 9, wherein said predetermined code tag comprises a code tag having a binary one as the rightmost bit and all binary zeroes as the remaining bits.

11. The method of claim 8, wherein said disallowed code tag comprises an all ones code tag.

12. The method of claim 11, wherein said predetermined code tag comprises a code tag having a binary zero as the rightmost bit and all binary ones as the remaining bits.

13. The method of claim 8, wherein said exiting comprises:
    detecting, during reverse synthesis of said pseudorandom sequence, said disallowed code tag;
    shifting bits of said disallowed code tag to the right, when said disallowed code tag is detected; and
    entering a binary digit at the left of the shifted disallowed code tag, such that the conventionally disallowed code tag is exited.

14. The method of claim 1, wherein said pinching out comprises:
    shifting bits of a selected code tag of said pseudorandom sequence to the right, during reverse synthesis; and
    entering, at the left of the shifted selected code tag, a value for a next bit of said pseudorandom sequence that is inverted from the value that would naturally occur at that position of said pseudorandom sequence.

15. The method of claim 1, further comprising using the bidirectionally synthesized pseudorandom sequence in a decoder, said decoder usable in providing absolute position information of one or more code tags of said pseudorandom sequence.

16. The method of claim 1, wherein said pinching out comprises:
    shifting bits of a selected code tag of said pseudorandom sequence to the left, during forward synthesis; and
    entering, at the right of the shifted selected code tag, a value for a next bit of said pseudorandom sequence that is inverted from the value that would naturally occur at that position of said pseudorandom sequence.

17. The method of claim 16, wherein said entering comprises one of the following:
substituting a binary one in said shifted selected code tag for a naturally occurring binary zero; and
substituting a binary zero in said shifted selected code tag for a naturally occurring binary one.

18. A method of bidirectionally synthesizing pseudorandom sequences, said method comprising:
selecting a resolution for which a pseudorandom sequence is to be bidirectionally synthesized; and
bidirectionally synthesizing said pseudorandom sequence for said selected resolution, said bidirectionally synthesizing using other than a maximal length sequence.

19. The method of claim 18, wherein said bidirectionally synthesizing comprises pinching out one or more code tags of said pseudorandom sequence.

20. The method of claim 18, wherein said selected resolution is a resolution of $2^N$, and wherein said bidirectionally synthesizing comprises including in said pseudorandom sequence a disallowed code tag.

21. The method of claim 18, wherein the bidirectionally synthesized pseudorandom sequence is usable by a decoder.

22. A bidirectional synthesizer comprising:
a bidirectional shifter that provides, at its outputs, bits of a pseudorandom sequence;
a feed forward network coupled to said bidirectional shifter that provides a next bit of said pseudorandom sequence, when said bidirectional shifter is proceeding in a forward direction;
a feed reverse network coupled to said bidirectional shifter that provides a next bit of said pseudorandom sequence, when said bidirectional shifter is proceeding in a reverse direction; and
one or more logic circuits coupled to said feed forward network and said feed reverse network that provides one or more of the following:
a code tag in said pseudorandom sequence that has conventionally been considered a disallowed code tag; and
a pinching out of one or more code tags of said pseudorandom sequence.

23. The bidirectional synthesizer of claim 22, wherein said bidirectional synthesizer is a component of a decoder.

24. A bidirectional synthesizer comprising:
means for bidirectionally synthesizing a pseudorandom sequence of a plurality of code tags; and
means for including in said pseudorandom sequence one code tag that has conventionally been considered a disallowed code tag.

25. The bidirectional synthesizer of claim 24, wherein each of said plurality of code tags comprises a plurality of bits, and wherein said means for bidirectionally synthesizing comprises:
a bidirectional shifter that provides, at its output, bits of said pseudorandom sequence;
a feed forward network coupled to said bidirectional shifter that provides a next bit of said pseudorandom sequence, when said bidirectional shifter is proceeding in a forward direction; and
a feed reverse network coupled to said bidirectional shifter that provides a next bit of said pseudorandom sequence, when said bidirectional shifter is proceeding in a reverse direction.

26. The bidirectional synthesizer of claim 25, wherein said means for including comprises one or more logic circuits coupled to said feed forward network and said feed reverse network that provide said one code tag.

27. The bidirectional synthesizer of claim 24, wherein said bidirectional synthesizer is a component of a decoder.

28. The bidirectional synthesizer of claim 27, wherein said decoder is coupled to an encoder.

29. The bidirectional synthesizer of claim 28, wherein said encoder comprises only one index sensor.

30. A synthesizing apparatus comprising:
a bidirectional synthesizer that bidirectionally synthesizes a pseudorandom sequence of a plurality of code tags, wherein said bidirectional synthesizer comprises:
one or more logic circuits that pinch out one or more code tags of said pseudorandom sequence.

31. The synthesizing apparatus of claim 30, wherein said synthesizing apparatus is a component of a decoder.

32. The synthesizing apparatus of claim 31, wherein said decoder is coupled to an encoder.

33. At least one program storage device readable by a machine, tangibly embodying at least one program of instructions executable by the machine to perform a method of synthesizing pseudorandom sequences, said method comprising:
bidirectionally synthesizing a pseudorandom sequence of a plurality of code tags, said bidirectionally synthesizing comprising at least one of the following:
including in said pseudorandom sequence a code tag that has conventionally been considered a disallowed code tag; and
pinching out one or more code tags of said pseudorandom sequence.

34. The at least one program storage device of claim 33, wherein said including comprises:
detecting, during forward synthesis of said pseudorandom sequence, a predetermined code tag of said pseudorandom sequence;
shifting bits of said predetermined code tag to the left, when said predetermined code tag is detected;
entering a binary digit at the right of the shifted predetermined code tag, such that the conventionally disallowed code tag is entered; and
exiting said disallowed code tag.

35. The at least one program storage device of claim 33, wherein said including comprises:
detecting, during reverse synthesis of said pseudorandom sequence, a predetermined code tag of said pseudorandom sequence;
shifting bits of said predetermined code tag to the right, when said predetermined code tag is detected;
entering a binary digit at the left of the shifted predetermined code tag, such that the conventionally disallowed code tag is entered; and
exiting said disallowed code tag.

36. The at least one program storage device of claim 33, wherein said pinching out comprises:
shifting bits of a selected code tag of said pseudorandom sequence to the left, during forward synthesis; and
entering, at the right of the shifted selected code tag, a value for a next bit of said pseudorandom sequence that is inverted from the value that would naturally occur at that position of said pseudorandom sequence.

37. The at least one program storage device of claim 33, wherein said pinching out comprises:

shifting bits of a selected code tag of said pseudorandom sequence to the right, during reverse synthesis; and entering, at the left of the shifted selected code tag, a value for a next bit of said pseudorandom sequence that is inverted from the value that would naturally occur at that position of said pseudorandom sequence.

38. An article of manufacture, comprising:

at least one computer usable medium having computer readable program code means embodied therein for causing the bidirectional synthesis of pseudorandom sequences, the computer readable program code means in said article of manufacture comprising:

computer readable program code means for causing a computer to select a resolution for which a pseudorandom sequence is to be bidirectionally synthesized; and computer readable program code means for causing a computer to bidirectionally synthesize said pseudorandom sequence for said selected resolution using other than a maximal length sequence.

39. At least one program storage device readable by a machine, tangibly embodying at least one program of instructions executable by the machine to perform a method of decoding, said method comprising:

accumulating a tag of a pseudorandom sequence provided by an encoder;

synthesizing a code tag of said pseudorandom sequence, wherein at least one of the following pertains to said pseudorandom sequence:

said pseudorandom sequence includes a disallowed code tag; and one or more code tags have been pinched out of said pseudorandom sequence;

comparing the accumulated tag and the synthesized code tag;

repeating said synthesizing and said comparing until said comparing indicates equality; and determining an absolute position of the accumulated tag, when equality is indicated.

40. The at least one program storage device of claim 39, wherein said method further comprises tracking movement of said encoder.

41. A decoder comprising:

an accumulator that receives tags of a pseudorandom sequence provided by an encoder;

a bidirectional synthesizer that synthesizes code tags of said pseudorandom sequence, wherein said bidirectional synthesizer provides at least one of the following:

an inclusion in said pseudorandom sequence of a code tag that has conventionally been considered a disallowed code tag; and a pinching out of one or more code tags of said pseudorandom sequence;

a comparator coupled to said accumulator and said bidirectional synthesizer, wherein said comparator compares accumulated tags and synthesized code tags; and a counter coupled to said comparator, wherein said counter indicates absolute position of one or more accumulated tags, when said comparator indicates equality.

42. The decoder of claim 41, wherein said accumulator receives bits of said tags via only one index channel input to said accumulator.

43. The decoder of claim 42, wherein a distance traversed on said encoder to provide a complete initial tag within said accumulator is minimized to a net traverse of N bits for a decoder utilizing N bit tags, regardless of whether direction reversals occur during the traverse.

44. The decoder of claim 41, further comprising means for resetting said decoder, when a failure is detected, wherein said accumulator is to receive a new initial tag from said encoder.

45. The decoder of claim 44, further comprising means for reporting a data invalid condition for one or more of the following conditions:

detection of said failure;

during receipt of said new initial tag by said accumulator; and prior to said comparator indicating an equality.

46. The decoder of claim 41, further comprising means for reporting a data valid condition when synchronization is established between the pseudorandom sequence provided by said encoder and the pseudorandom sequence synthesized by the bidirectional synthesizer.

47. The decoder of claim 41, wherein said decoder works with one or more of the following spatial timing ratios: 1:1, 2:1, and 4:1.

48. The decoder of claim 41, wherein said decoder is implementable on a programmable logic device.

49. The decoder of claim 41, wherein each of said code tags comprises a plurality of bits, and wherein said bidirectional synthesizer comprises:

a bidirectional shifter that provides, at its outputs, bits of said pseudorandom sequence;

one or more feed forward circuits coupled to said bidirectional shifter that provide a next bit of said pseudorandom sequence, when said bidirectional shifter is proceeding in a forward direction;

one or more feed reverse circuits coupled to said bidirectional shifter that provide a next bit of said pseudorandom sequence, when said bidirectional shifter is proceeding in a reverse direction; and one or more logic circuits coupled to said one or more feed forward circuits and said one or more feed reverse circuits that provide at least one of said inclusion and said pinching out.

50. A method of decoding, comprising:

accumulating a tag of a pseudorandom sequence provided by an encoder;

synthesizing a code tag of said pseudorandom sequence, wherein at least one of the following pertains to said pseudorandom sequence:

said pseudorandom sequence includes a disallowed code tag; and one or more code tags have been pinched out of said pseudorandom sequence;

comparing the accumulated tag and the synthesized code tag;

repeating said synthesizing and said comparing until said comparing indicates equality; and determining an absolute position of the accumulated tag, when equality is indicated.

51. The method of claim 50, wherein said accumulating comprises receiving bits of said tag via only one index sensor of said encoder.

52. The method of claim 50, wherein said accumulating comprises traversing said encoder to accumulate said tag, wherein said tag includes N bits, and wherein said traversing is minimized to a net traverse of N bits regardless of any direction reversals during said traversing.

53. The method of claim 52, wherein said traversing comprises:

moving in one or more directions to obtain said N bits; and determining an offset to be used to adjust said absolute position to correct for any direction reversals.

54. The method of claim 53, wherein said determining comprises using a counter.

55. The method of claim 50, further comprising tracking movement of said encoder.

56. The method of claim 55, wherein said tracking comprises:

accumulating tags of said pseudorandom sequence provided by said encoder;

bidirectionally synthesizing code tags of said pseudorandom sequence;

comparing said accumulated tags and said synthesized code tags until said comparing indicates an inequality, an error is encountered, or power is turned off; and updating said absolute position, when comparing indicates equality.

57. The method of claim 55, further comprising reporting a data valid condition during said tracking.

58. The method of claim 50, further comprising reporting a data invalid condition when one or more of the following conditions exists:

an error is detected;

said comparing indicates an inequality; and during accumulation of said tag.

59. A decoder comprising:

means for accumulating a tag of a pseudorandom sequence provided by an encoder;

means for synthesizing a code tag of said pseudorandom sequence, wherein at least one of the following pertains to said pseudorandom sequence:

said pseudorandom sequence includes a disallowed code tag; and one or more code tags have been pinched out of said pseudorandom sequence;

means for comparing the accumulated tag and the synthesized code tag;

means for repeating said synthesizing and said comparing until said comparing indicates equality; and means for determining an absolute position of the accumulated tag, when equality is indicated.

60. The decoder of claim 59, further comprising means for tracking movement of said encoder.

61. The decoder of claim 60, further comprising means for reporting a data valid condition during said tracking.

62. The decoder of claim 59, further comprising means for reporting a data invalid condition when a predefined condition is satisfied.

63. An article of manufacture, comprising:

at least one computer usable medium having computer readable program code means embodied therein for causing decoding, the computer readable program code means in said article of manufacturing, comprising:

computer readable program code means for causing a computer to accumulate a tag of a pseudorandom sequence provided by an encoder;

computer readable program code means for causing a computer to synthesize a code tag of said pseudorandom sequence, wherein at least one of the following pertains to said pseudorandom sequence:

said pseudorandom sequence includes a disallowed code tag; and one or more code tags have been pinched out of said pseudorandom sequence;

computer readable program code means for causing a computer to compare the accumulated tag and the synthesized code tag;

computer readable program code means for causing a computer to repeat said synthesizing and said comparing until said comparing indicates equality; and computer readable program code means for causing a computer to determine an absolute position of the accumulated tag, when equality is indicated.

* * * * *

Disclaimer

6,127,948 — Alexander E. Hillis, Cambridge, NY (US); Ronald P. LaBarge, East Greenbush, NY (US); Robert A. Williams, Troy, NY (US). BIDIRECTIONAL SYNTHESIS OF PSEUDORANDOM SEQUENCES FOR ARBITRARY ENCODING RESOLUTIONS. Patent dated October 3, 2000. Disclaimer filed September 15, 2014, by the assignee, Gurley Precision Instruments, Inc.

Hereby disclaims all complete claims 1-63 of said patent.

*(Official Gazette, October 21, 2014)*